US012631823B2

(12) United States Patent
Hsia et al.

(10) Patent No.: US 12,631,823 B2
(45) Date of Patent: May 19, 2026

(54) PACKAGES WITH PHOTONIC ENGINES AND METHOD OF FORMING THE SAME

(71) Applicant: Taiwan Semiconductor Manufacturing Co., Ltd., Hsinchu (TW)

(72) Inventors: Hsing-Kuo Hsia, Jhubei (TW); Chen-Hua Yu, Hsinchu (TW); Jui Lin Chao, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 512 days.

(21) Appl. No.: 18/151,044

(22) Filed: Jan. 6, 2023

(65) Prior Publication Data

US 2024/0094469 A1 Mar. 21, 2024

Related U.S. Application Data

(60) Provisional application No. 63/377,133, filed on Sep. 26, 2022, provisional application No. 63/376,456, filed on Sep. 21, 2022.

(51) Int. Cl.
| | |
|---|---|
| *G02B 6/132* | (2006.01) |
| *G02B 6/12* | (2006.01) |
| *G02B 6/136* | (2006.01) |
| *H01L 21/768* | (2006.01) |
| *H01L 23/48* | (2006.01) |
| *H01L 25/16* | (2023.01) |

(52) U.S. Cl.
CPC ......... *G02B 6/132* (2013.01); *G02B 6/12004* (2013.01); *G02B 6/136* (2013.01);
(Continued)

(58) Field of Classification Search
CPC .... G02B 6/132; G02B 6/12004; G02B 6/136; G02B 2006/12104; G02B 2006/12102;
(Continued)

(56) References Cited

U.S. PATENT DOCUMENTS 10,162,139 B1 * 12/2018 Wang ..................... G02B 6/122
11,150,404 B2 10/2021 Huang et al.
(Continued)

FOREIGN PATENT DOCUMENTS

| TW | 201743577 A | 12/2017 |
|---|---|---|
| TW | 201905519 A | 2/2019 |
| TW | 202002052 A | 1/2020 |

OTHER PUBLICATIONS

Baba, T., et al., "Photonic Crystal Light Deflection Devices Using the Superprism Effect," IEEE Journal of Quantum Electronics, vol. 38, No. 7, Jul. 2002, pp. 909-914.
(Continued)

*Primary Examiner* — Michelle R Connelly
(74) *Attorney, Agent, or Firm* — Slater Matsil, LLP

(57) ABSTRACT

A method includes patterning a top silicon layer in a substrate to form a plurality of photonic devices. The substrate includes the top silicon layer, a first dielectric layer under the top silicon layer, and a semiconductor layer under the first dielectric layer. The method further includes forming a second dielectric layer to embed the plurality of photonic devices therein, forming an interconnect structure over and signally coupling to the plurality of photonic devices, bonding an electronic die to the interconnect structure, thinning the semiconductor layer, and patterning the semiconductor layer that has been thinned to form openings. The openings are filled with a dielectric material to form dielectric regions. Through-vias are formed to penetrate through the dielectric regions to electrically couple to the interconnect structure.

20 Claims, 39 Drawing Sheets

(52) U.S. Cl.
CPC ...... H01L 21/76898 (2013.01); H01L 23/481
(2013.01); H01L 25/167 (2013.01); *G02B*
*2006/12104* (2013.01)

(58) Field of Classification Search
CPC ................ G02B 6/4206; G02B 6/4214; H01L
21/76898; H01L 23/481; H01L 25/167
See application file for complete search history.

(56) References Cited

U.S. PATENT DOCUMENTS

| | | | |
|---|---|---|---|
| 11,901,196 B2 | 2/2024 | Yu et al. | |
| 2019/0250327 A1* | 8/2019 | Huang | G02B 6/4274 |
| 2019/0372676 A1* | 12/2019 | Iida | H04B 10/80 |
| 2021/0057365 A1* | 2/2021 | Kuo | H01L 24/11 |
| 2021/0280568 A1 | 9/2021 | Traverso et al. | |
| 2021/0343671 A1 | 11/2021 | Chen et al. | |
| 2023/0194778 A1* | 6/2023 | Kim | G02B 6/13 |
| | | | 385/14 |
| 2023/0411369 A1* | 12/2023 | Karhade | H01L 25/167 |

OTHER PUBLICATIONS

Digaum, J., et al., "Tight control of light beams in photonic crystals with spatially-variant lattice orientation," Optics Express, vol. 22, No. 21, Oct. 20, 2014, pp. 25788-25804.

* cited by examiner

84EC(84)

82

84EC(84)

82

88

88-1
88-2

88-n

84EC(84)

85SE   85   85VE

82

88

84EC(84)

α

86SE

82

86VE2   86   86VE1

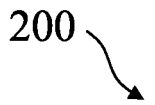

200

| Forming photonic devices from an SOI substrate | — 202 |
| Forming a dielectric layer | — 204 |
| Forming an redistribution structure and waveguides | — 206 |
| Bonding an electronic die | — 208 |
| Gap-filling | — 210 |
| Attaching a supporting substrate | — 212 |
| Thinning a semiconductor layer in the SOI substrate | — 214 |
| Patterning the semiconductor layer and a dielectric layer in the SOI substrate | — 216 |
| Forming a reflector | — 218 |
| Filling openings | — 220 |
| Forming through-vias | — 222 |
| Forming electrical connectors | — 224 |
| Singulation | — 226 |

FIG. 61

PACKAGES WITH PHOTONIC ENGINES AND METHOD OF FORMING THE SAME

PRIORITY CLAIM AND CROSS-REFERENCE

This application claims the benefit of the following provisionally filed U.S. patent application: Application No. 63/377,133, filed on Sep. 26, 2022, and entitled "Semiconductor Package and Method of Forming the Same," and Application No. 63/376,456, filed on Sep. 21, 2022, and entitled "COUPE with Remained Silicon/Silicon Oxide as Structural Backbone for Mechanically Robust Construction and the Amelioration of the Structure," which applications are hereby incorporated herein by reference.

BACKGROUND

Integrated circuits are having increasingly more functions. In order to integrate more functions together, a plurality of device dies are manufactured, and are packaged together in a packaging process(es). The plurality of device dies are electrically interconnected in order to work together. Signals are transferred between the device dies and packages to implement the intercommunication.

With the increasingly demanding requirement of high-performance applications, optical signals are increasingly used for signal communications due to their high speed and low latency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 61 illustrates a process flow for forming a package in accordance with some embodiments.

DETAILED DESCRIPTION

Figure 1:
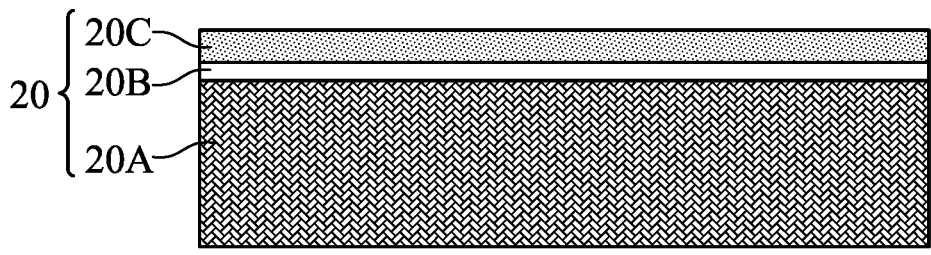
FIGS. 1-11, 12A, 12B, and 13-17 illustrate the intermediate stages in the formation of some packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages and the method of forming the same are provided. In accordance with some embodiments of the present disclosure, a Silicon-On-Insulator (SOI) substrate is used, which includes a bottom semiconductor layer (a bulk substrate), a dielectric layer, and a top silicon layer. The top silicon layer is used to form photonic devices. An interconnect structure is formed over the photonic devices, and an electronic die is bonded on the interconnect structure. The bottom semiconductor layer is then thinned, with a portion left after thinning. Additional devices such as reflectors, waveguides, and/or the like, may then be formed on the backside of the thinned bottom semiconductor layer. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-11, 12A, 12B, and 13-17 illustrate the cross-sectional views of intermediate stages in the formation of some packages incorporating photonic engines in accordance with some embodiments of the present disclosure. The corresponding processes are also reflected schematically in the process flow 200 as shown in FIG. 61.

Referring to FIG. 1, substrate 20 is provided. In accordance with some embodiments, substrate 20 is a Silicon-on-Insulator (SOI) substrate including semiconductor layer 20A, dielectric layer 20B over semiconductor layer 20A, and photonic layer 20C (which is a blanket layer) over dielectric layer 20B. In accordance with some embodiments, semiconductor layer 20A includes a semiconductor substrate such as a silicon substrate. Semiconductor layer 20A may have a single-crystalline structure. The thickness of semiconductor layer 20A may be in the range between about 500 μm and about 2,000 μm.

Dielectric layer 20B may be formed of or comprise silicon oxide, or may be formed of or comprise other dielectric materials (such as silicon oxynitride) that are transparent to light. Dielectric layer 20B may have a thickness in the range between about 0.5 μm and about 4 μm. In accordance with some embodiments, photonic layer 20C is formed of or comprises silicon. In accordance with alternative embodiments, photonic layer 20C is formed of or comprises a III-V compound semiconductor material, lithium niobate, a polymer, or the like. Photonic layer 20C is referred to as silicon layer 20C hereinafter, while it may also be formed of other materials, as aforementioned. The thickness of photonic layer 20C may be in the range between about 500 nm and about 1,500 nm.

Substrate 20 has a front side or front surface (e.g., the side facing upwards in FIG. 1), and a backside or back surface (e.g., the side facing downwards in FIG. 1). The front side of substrate 20 is also referred to as the front side of the resulting photonic wafer and photonic die.

Figure 2:
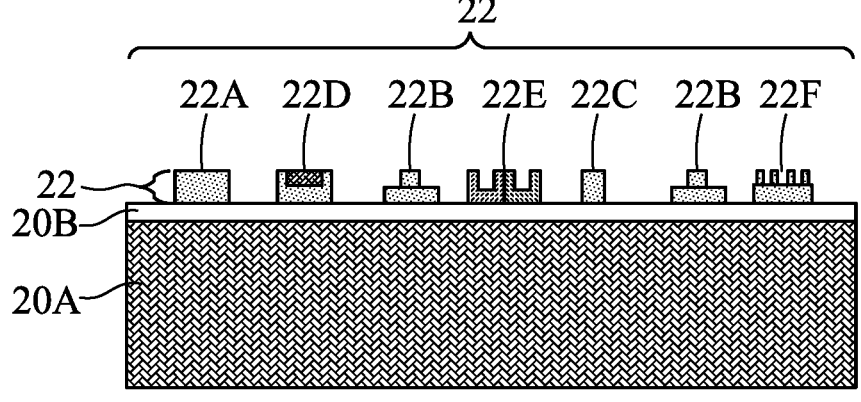

In FIG. 2, silicon layer 20C is patterned to form a plurality of photonic devices 22, which are alternatively referred to as optical devices or silicon (photonic) devices. The respective process is illustrated as process 202 in the process flow 200 as shown in FIG. 61. Silicon layer 20C may be patterned using suitable photolithography and etching techniques, which may involve etching processes using photoresists to define patterns.

Some examples of the photonic devices 22 include waveguides 22A, slab waveguides 22B, tip waveguides 22C, germanium modulators 22D, PN modulators 22E, grating couplers 22F, photodetectors (not shown), and/or the like. Tip waveguides 22C are narrow waveguides, for example, having widths in the range between about 1 nm and about 200 nm. A PN modulators 22E may include a p-type doped region and an n-type doped region joining to each other. A photodetector may be optically coupled to one of the waveguides 22B to detect optical signals within the waveguide and generate electrical signals corresponding to the optical signals. In accordance with other embodiments, photonic devices 22 may include other active or passive components, such as laser diodes, optical signal splitters, or other types of photonic structures or devices.

The formation of a germanium modulator 22D may include filling germanium into a recess in a patterned silicon component formed from silicon layer 20C. Modulators such as germanium modulator 22D and PN modulators 22E may be used for electrical-to-optical signal modulation and transversion. The modulators may receive electrical signals and modulate optical power within a waveguide to generate corresponding optical signals. In this manner, photonic devices 22 may input optical signals from, or output optical signal to, waveguides.

Figure 3:
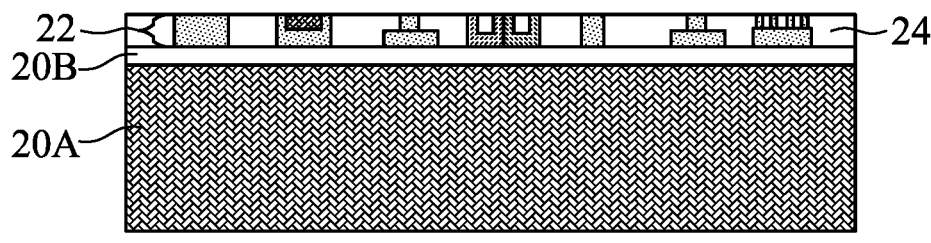

Referring to FIG. 3, dielectric layer 24 is formed. The respective process is illustrated as process 204 in the process flow 200 as shown in FIG. 61. The formation process may include depositing a dielectric layer, and performing a planarization process such as a Chemical Mechanical Polish (CMP) process or a mechanical grinding process. Accordingly, the top surfaces of photonic devices 22 are coplanar with the top surface of dielectric layer 24. Dielectric layer 24 may be formed of or comprise an oxide such as silicon oxide in accordance with some embodiments, while other dielectric materials that are also transparent to light may also be used.

Figure 4:
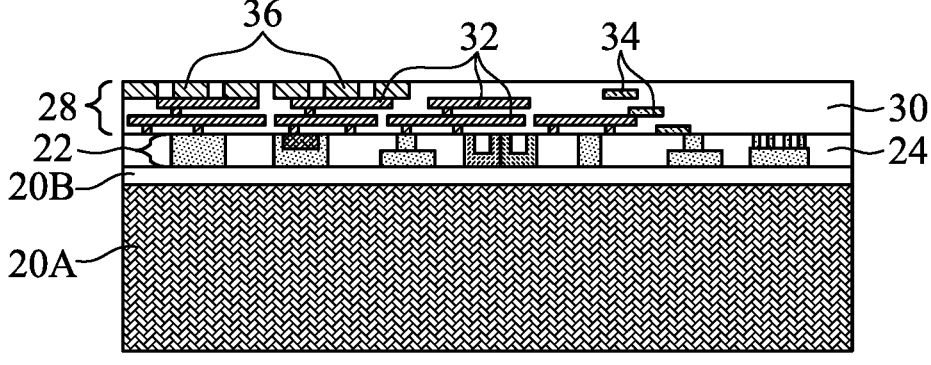

Referring to FIG. 4, redistribution structure 28 is formed over dielectric layer 24. The respective process is illustrated as process 206 in the process flow 200 as shown in FIG. 61. Redistribution structure 28 includes dielectric layers 30 and conductive features 32 formed in dielectric layers 30. Conductive features 32 provide electric al interconnections and electrical routing. Conductive features 32 are electrically connected to modulators, photodetectors, and or the like. Dielectric layers 30 may be, for example, insulating layers and/or passivating layers, and may comprise silicon oxide, silicon nitride, or the like. Dielectric layers 30 may be transparent to light, or may be opaque if no optical signal is to be passed through them. Dielectric layers 30 may be formed through a damascene process. Conductive pads 36 are formed in the topmost layer of dielectric layers 30.

In dielectric layers 30, waveguides 34 may also be formed. The respective process is also illustrated as process 206 in the process flow 200 as shown in FIG. 61. In accordance with some embodiments, waveguides 34 are formed of silicon nitride, and hence are referred to as nitride waveguide 34 hereinafter. Nitride waveguides 34, although the name, may also include other photonic structures such as grating couplers and edge couplers, that allow optical signals to be transmitted or processed. Silicon nitride has a higher dielectric constant than silicon, and thus a nitride waveguide may have a greater internal confinement of light than a silicon waveguide. This may also allow the performance or leakage of nitride waveguides to be less sensitive to process variations, less sensitive to dimensional uniformity, and less sensitive to surface roughness (e.g., edge roughness or linewidth roughness).

Figure 5:
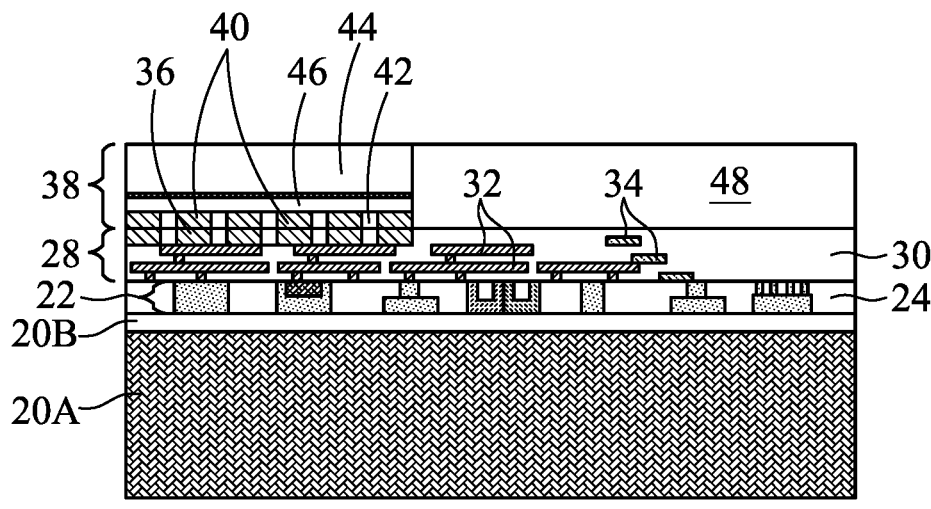

Referring to FIG. 5, electronic die 38 is bonded to redistribution structure 28. The respective process is illustrated as process 208 in the process flow 200 as shown in FIG. 61. Electronic die 38 may also be referred to as an Electronic Integrated Circuit (EIC) die. Although one electronic die 38 is illustrated, a plurality of electronic dies 38 that are identical to each other may be bonded to interconnect structure 28. Electronic die 38 may include integrated circuits that communicate with photonic devices 22 using electrical signals. Electronic die 38 includes semiconductor substrate 44, integrated circuits 46 (schematically illustrated), and electrical connectors 40, which may be in surface dielectric layer 42. Electrical connectors 40 may include, for example, conductive pads, conductive pillars, or the like.

In accordance with some embodiments, electronic die 38 is bonded to redistribution structure 28 through hybrid bonding (which includes both of dielectric-to-dielectric bonding and metal-to-metal bonding), direct metal-to-metal bonding, solder bonding, or the like. For example, when hybrid bonding is adopted, surface dielectric layer 42 in electronic die 38 may be bonded to the top surface dielectric layer 30 in interconnect structure 28 through fusion bonding, while electric connectors 40 in electronic die 38 may be bonded to bond pads 36 through metal-to-metal direct bonding.

Integrated circuits 46 have the function of interfacing with photonic devices 22, and may include the circuits for controlling the operation of photonic devices 22. For example, electronic die 38 may include controllers, drivers, amplifiers, the like, or combinations thereof. Electronic die 38 may also include a Central Processing Unit (CPU). In accordance with some embodiments, electronic die 38 includes the circuits for processing electrical signals received from photonic devices 22. Electronic die 38 may also control high-frequency signaling of photonic devices 22 according to the electrical signals (digital or analog) received from another device or die. In accordance with some embodiments, electronic die 38 may provide Serializer/Deserializer (SerDes)

functionality, so that electronic die 38 may act as a part of an I/O interface between optical signals and electrical signals.

Further referring to FIG. 5, gap-filling material 48 is formed on electronic die 38 and redistribution structure 28. The respective process is illustrated as process 210 in the process flow 200 as shown in FIG. 61. Gap-filling material 48 may be transparent to light at wavelengths suitable for transmitting optical signals or optical power therein. For example, gap-filling material 48 may be formed of or comprise silicon oxide, silicon nitride, a polymer, the like, or a combination thereof. Gap-filling material 48 may be formed through Chemical Vapor Deposition (CVD), Physical Vapor Deposition (PVD), Atomic Layer Deposition (ALD), spin-on coating, Flowable Chemical Vapor Deposition (FCVD), or the like. Gap-filling material 48 may be planarized using a planarization process such as a Chemical Mechanical Polish (CMP) process, a mechanical grinding process, or the like. In accordance with some embodiments, the planarization process may expose electronic die 38, with the top surfaces of electronic die 38 and gap-filling material 48 being coplanar.

Figure 6:
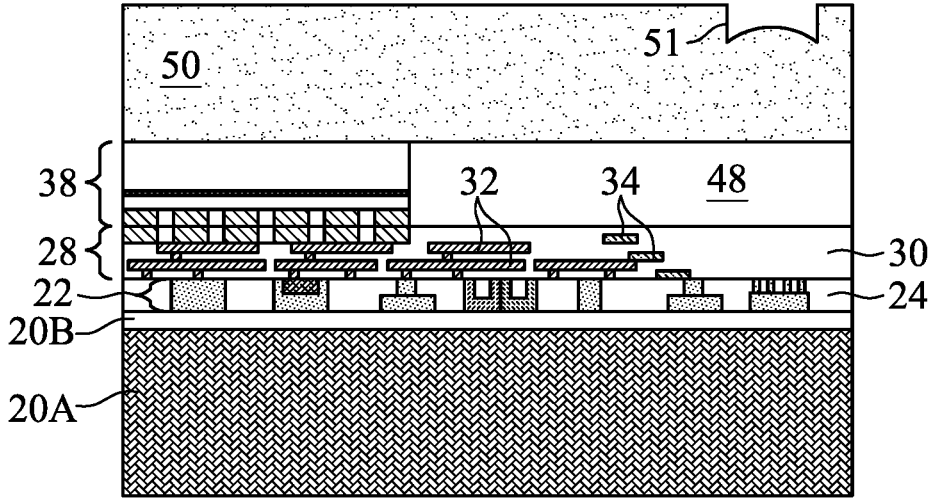

FIG. 6 illustrates the attachment of supporting substrate 50. The respective process is illustrated as process 212 in the process flow 200 as shown in FIG. 61. In accordance with some embodiments, supporting substrate 50 is or comprises a silicon substrate. A silicon-containing dielectric layer (not shown), which may comprise silicon oxide, silicon oxynitride, silicon carbo-nitride, or the like, may be used to bond supporting substrate 50 to the semiconductor substrate of electronic die 38. Alternatively, supporting substrate 50 physically contacts, and is bonded to, electronic die 38 and gap-filling material 48. The bonding may be performed through fusion bonding, with Si—O—Si bonds formed. Supporting substrate 50 may include optical lens 51 in accordance with some embodiments. Optical lens 51 may be formed by etching supporting substrate 50.

Figure 7:
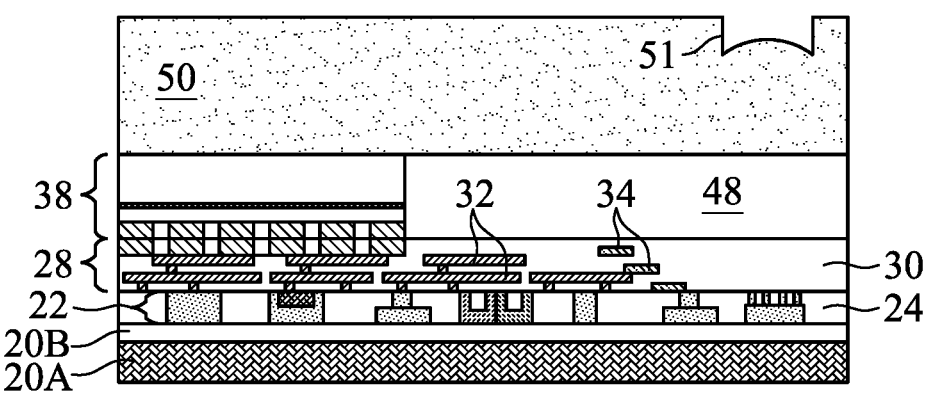

Next, semiconductor layer 20A is thinned through a backside grinding process. The respective process is illustrated as process 214 in the process flow 200 as shown in FIG. 61. The resulting structure is shown in FIG. 7. Semiconductor layer 20A may be thinned through a planarization process (e.g., a CMP process or a mechanical grinding process), an etching process, a combination thereof, or the like. After the thinning process, the thickness of the remaining semiconductor layer 20A may be in the range between about 1 μm and about 4 μm. Thinning semiconductor layer 20A rather than removing semiconductor layer 20A and dielectric layer 20B has some advantageous features. If semiconductor layer 20A and dielectric layer 20B are removed, photonic devices 22 may be damaged. Leaving a thin semiconductor layer 20A reduces the possibility of damage without affecting the ability of optical signal transferring. Furthermore, leaving semiconductor layer 20A and dielectric layer 20B unremoved may improve the resistance of the resulting structure to mechanical processes such as polishing in subsequent processes.

Figure 8:
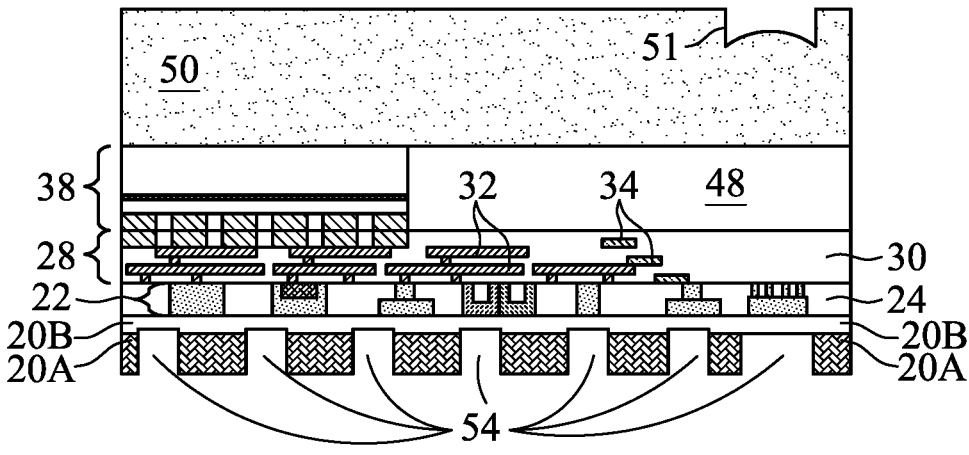

Referring to FIG. 8, semiconductor layer 20A is patterned through an etching process, so that openings 54 are formed. The respective process is illustrated as process 216 in the process flow 200 as shown in FIG. 61. The etching of semiconductor layer 20A may be performed using dielectric layer 20B as an etch stop layer. Accordingly, openings 54 are separated from photonic devices 22 and dielectric layer 24 by dielectric layer 20B. Also, openings 54 may extend into dielectric layer 20B slightly.

Figure 9:
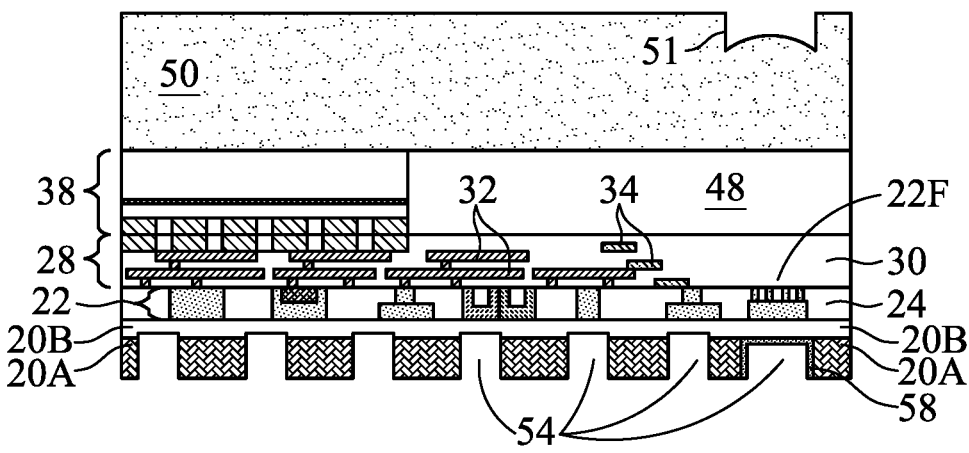

FIG. 9 illustrates the formation of reflector 58 in accordance with some embodiments. The respective process is illustrated as process 218 in the process flow 200 as shown in FIG. 61. In accordance with some embodiments, reflector 58 comprises a metal layer, which may be formed of or comprise Cu, TaN, TaO$_2$, TiO$_2$, nickel, tungsten, or the like, or alloys thereof. The thickness of reflector 58 may be in the range between about 0.1 μm and about 0.2 μm.

Figure 13:
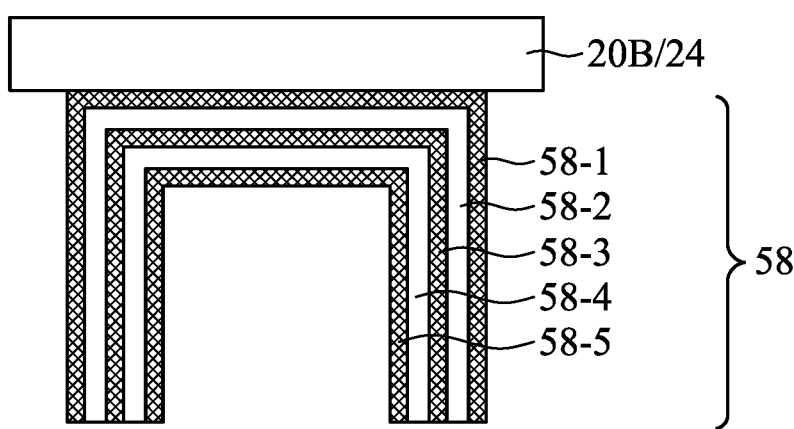

In accordance with alternative embodiments, reflector 58 comprises dielectric layers formed of or comprising alternating layers with higher refractive index and lower refractive index. Accordingly, reflector 58 includes a plurality of pairs of layers, with each pair comprising a higher-refractive layer and a lower-refractive index layer. For example, FIG. 13 illustrates a magnified view of a portion of the structure including reflector 58. Dielectric layers 20B and 24 (referred to as 20B/24) and layer 58-1 form a first pair, with layer 20B/24 and layer 58-1 being the higher-refractive layer and the lower-refractive layer, respectively. Dielectric layers 58-2 and 58-3 form a higher-refractive layer and a lower-refractive layer, respectively. Dielectric layers 58-4 and 58-5 form a higher-refractive layer and a lower-refractive layer, respectively.

The material of dielectric layers 58-1 through 58-4 may be selected from a plurality of materials. For example, Si and SiN may be used to form a higher-refractive layer and lower-refractive layer, respectively. Si and SiO$_2$ may also be used to form a higher-refractive layer and lower-refractive layer, respectively. Light reflects at the interfaces of the dielectric layers with different refractive indices, and the increase in the number of pairs results in increased reflection.

The formation of reflector 58 may include blanket deposition process(es) to deposit the desirable materials, and removing the materials from undesirable locations (for example, through a photolithography process). Reflector 58 has the function of reflecting light back to the overlying photonic device such as the grating coupler 22F, so that the light-collecting efficiency is improved.

Figure 10:
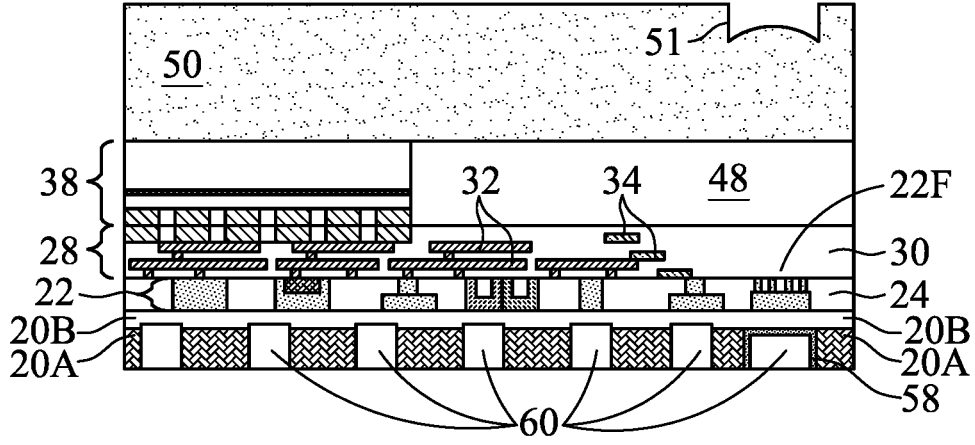

FIG. 10 illustrates the formation of dielectric regions 60 to fill openings 54. The respective process is illustrated as process 220 in the process flow 200 as shown in FIG. 61. In accordance with some embodiments, dielectric regions 60 are formed of silicon oxide, silicon oxynitride, or the like.

Figure 11:
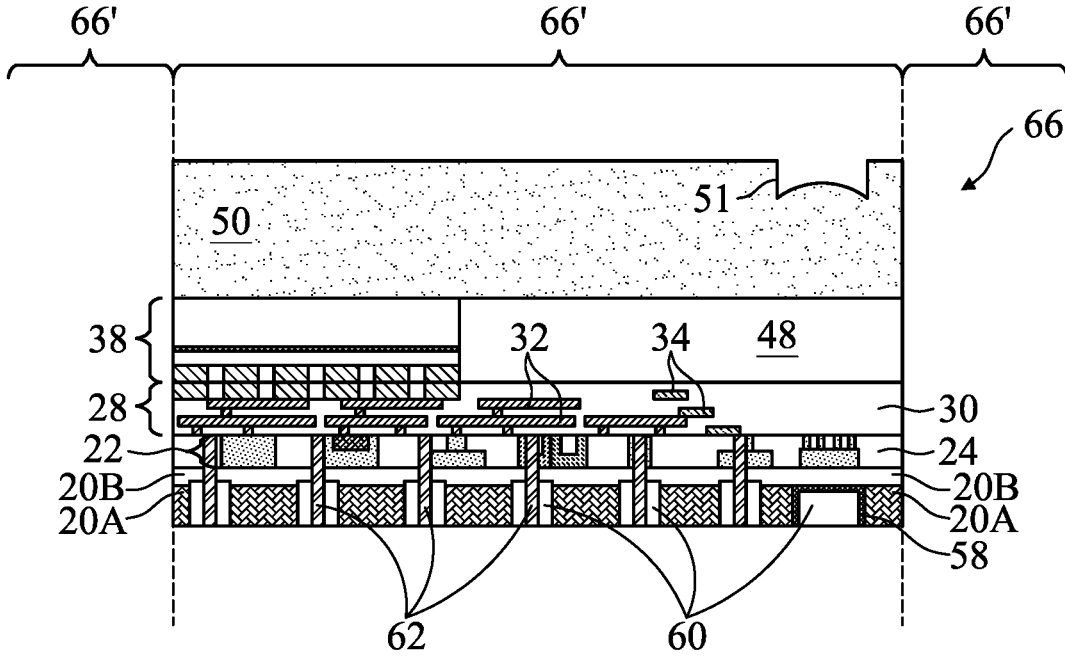
Figure 14:
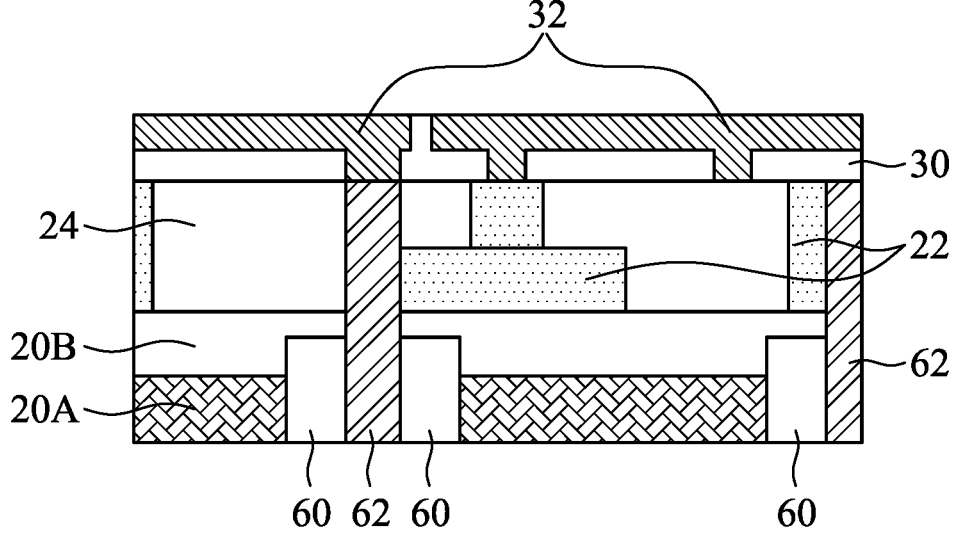

Referring to FIG. 11, (electrical conductive) through-vias 62 are formed to penetrate through dielectric regions 60, dielectric layer 20B, and dielectric layer 24. The respective process is illustrated as process 222 in the process flow 200 as shown in FIG. 61. Through-vias 62 are electrically connected to conductive features 32 in interconnect structure 28, and are electrically isolated from semiconductor layer 20A. The formation process may include etching-through dielectric regions 60, dielectric layer 20B, and dielectric layer 24 to form via openings and to reveal conductive features 32, filling the via openings with conductive materials (such as TiN, TaN, Ti, Ta, Cu, W, Co, or the like), and performing a planarization process. FIG. 14 illustrates a magnified view of a portion of the structure shown in FIG. 11. Dielectric region 60 may extend into dielectric layer 20B slightly, with through-via 62 penetrating through both of dielectric region 60 and dielectric layer 20B.

Figure 12A:
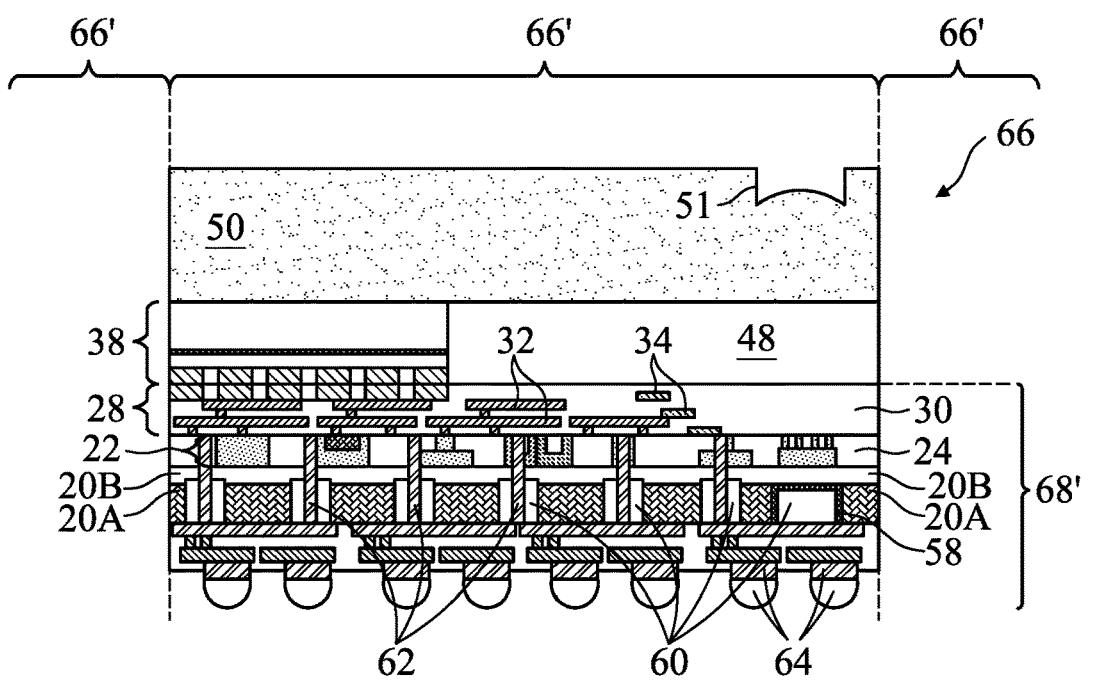
Figure 12B:
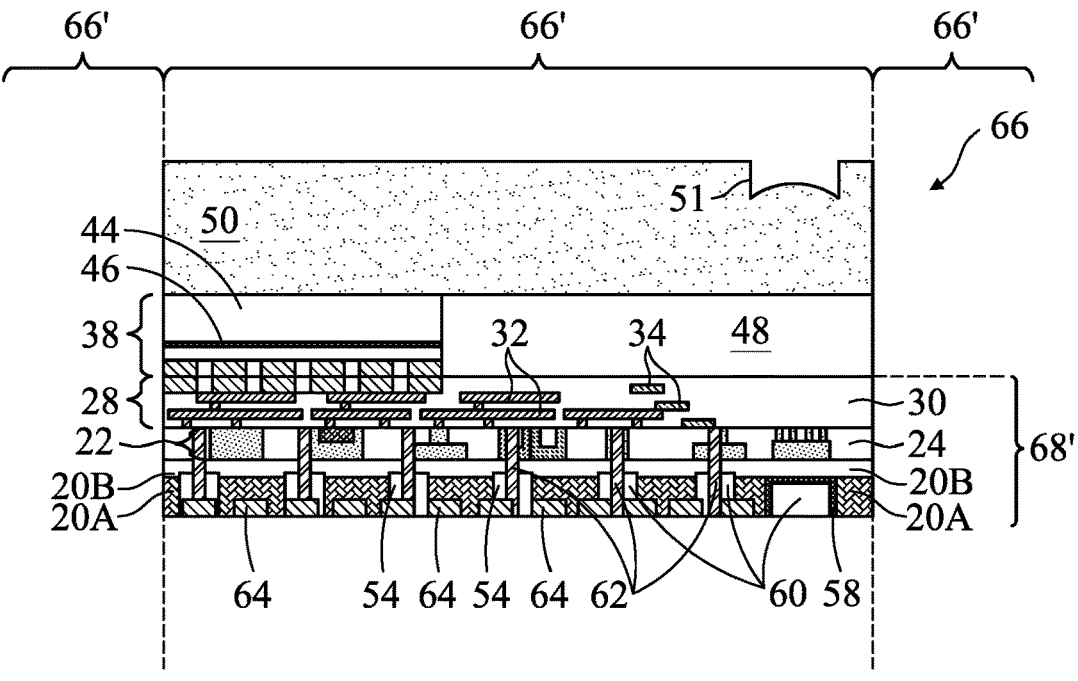

Referring to FIGS. 12A and 12B, electrical connectors 64 are formed in accordance with various embodiments. The respective process is illustrated as process 224 in the process flow 200 as shown in FIG. 61. The structure shown in FIGS. 12A and 12B are referred to as reconstructed wafers 66. In the embodiments shown in FIG. 12A, the electrical connectors 64 include metal pillars and solder regions, which may be used for solder bonding. In the embodiments shown in FIG. 12B, the electrical connectors 64 include bond pads that have their surfaces coplanar with the surfaces of dielectric regions 60. The package 66' in FIG. 12B may be bonded to other package components through hybrid bonding.

In a subsequent process, a singulation process is performed to saw a reconstructed wafer 66 into a plurality of packages 66', which include optical engines. The respective process is also illustrated as process 226 in the process flow 200 as shown in FIG. 61. Package 66' includes photonic die (PIC) 68' and electronic die (EIC) 38 therein.

Figure 15:
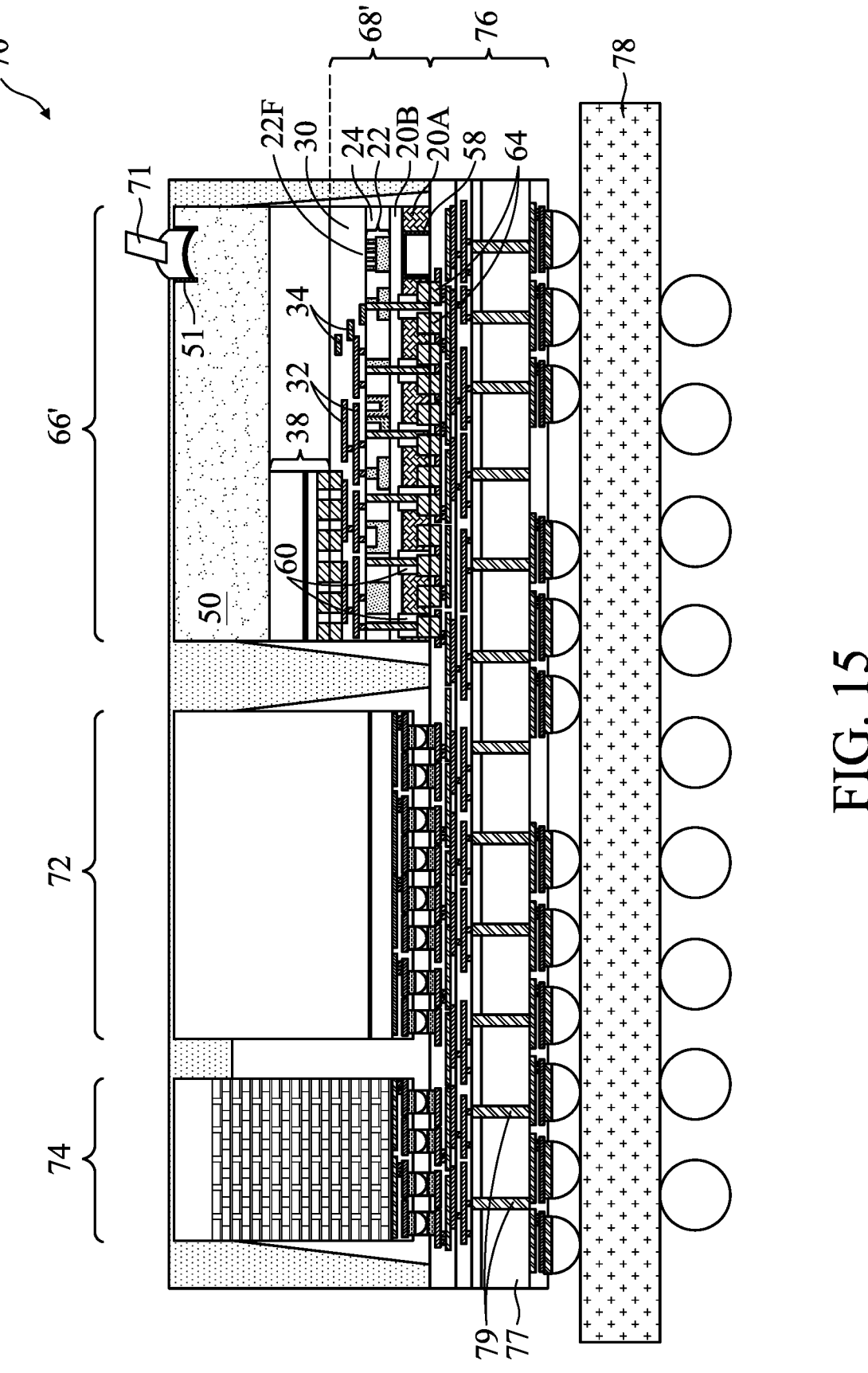
Figure 16:
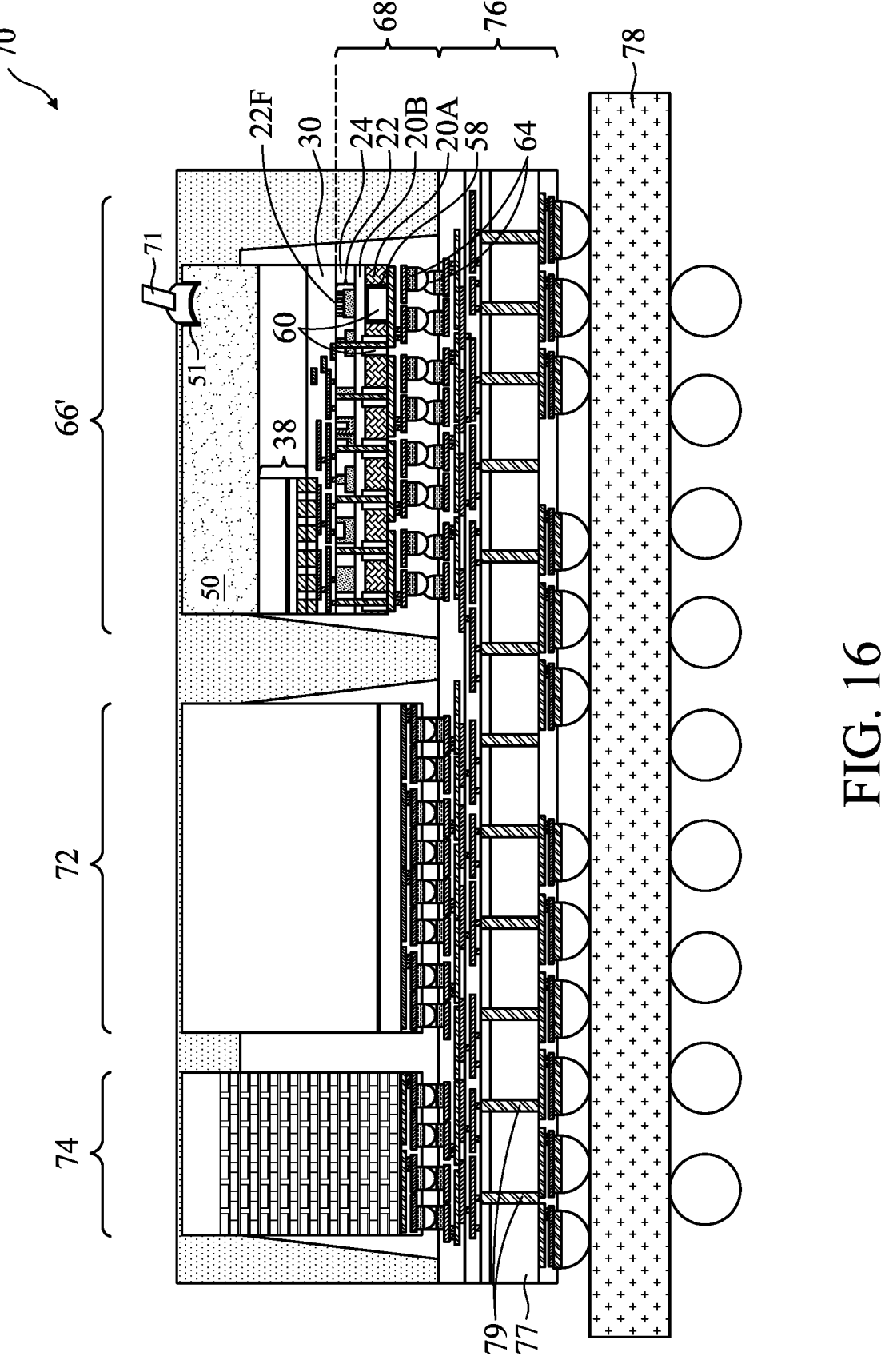
Figure 17:
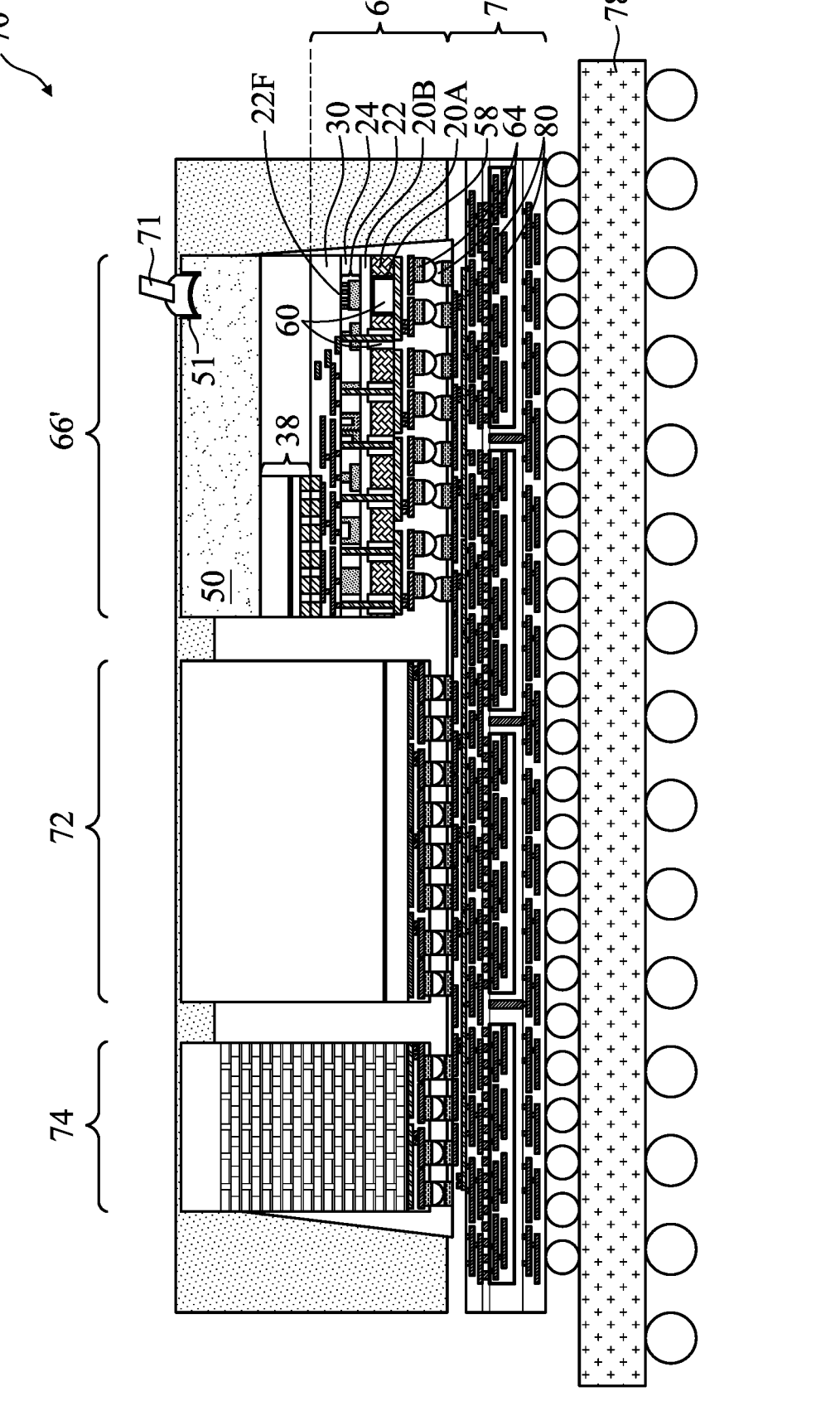

FIGS. 15, 16, and 17 illustrate the packages 70 formed in accordance with some embodiments. A plurality of package components such as device die 72 and memory stack 74 are bonded to interposer 76 along with package 66'. Interposer 76 is further bonded to package component 78. The bonding may be achieved through hybrid bonding, solder bonding, or the like. In accordance with some embodiments, device die 72 comprises computing dies, which may include CPU dies, Graphic Processing Unit (GPU) dies, mobile application dies, Micro Control Unit (MCU) dies, BaseBand (BB) dies, Application processor (AP) dies, or the like. Package component 78 may be a package substrate, a printed circuit board, a package, or the like.

Optical fiber 71 may be attached to optical lens 51, which is filled with an optical glue. In accordance with some embodiments, a light beam is projected from optical fiber 71 into grating coupler 22F, which redirect the light beam horizontally into other photonic devices 22 such as a waveguide. The light not collected by grating coupler 22F may be reflected by reflector 58 back to grating coupler 22F again, and redirected. The reflector 58 thus improves the efficiency in the light-redirection.

Interposer 76 may include silicon substrate 77, and through-vias 79 penetrating through silicon substrate 77. FIG. 15 illustrates the embodiments in which the electrical connectors 64 in package 66' include bond pads. FIG. 16 illustrates the embodiments in which the electrical connectors 64 in package 66' include metal pillars and solder regions. FIG. 17 illustrates that the interposer 76 is a Local Silicon Interconnect (LSI) interposer including one or more LSI die(s) 80 built therein. LSI die(s) 80 include built-in routing metal lines, and are used to electrically interconnect neighboring package components 72, 74, and 66'.

FIGS. 18-20, 21A, 21B, and 22-24 illustrate the intermediate stages in the formation of some packages having backside waveguides in accordance with some embodiments. Unless specified otherwise, the materials, the structures, and the formation processes of the components in these embodiments are essentially the same as the like components denoted by like reference numerals in the preceding embodiments. The details regarding the materials, the structures, and the formation processes of the components shown in these embodiment (and in the embodiments shown in FIGS. 25-31, 32A, 32B, and 33-35) may thus be found in the discussion of the preceding embodiments.

Figure 18:
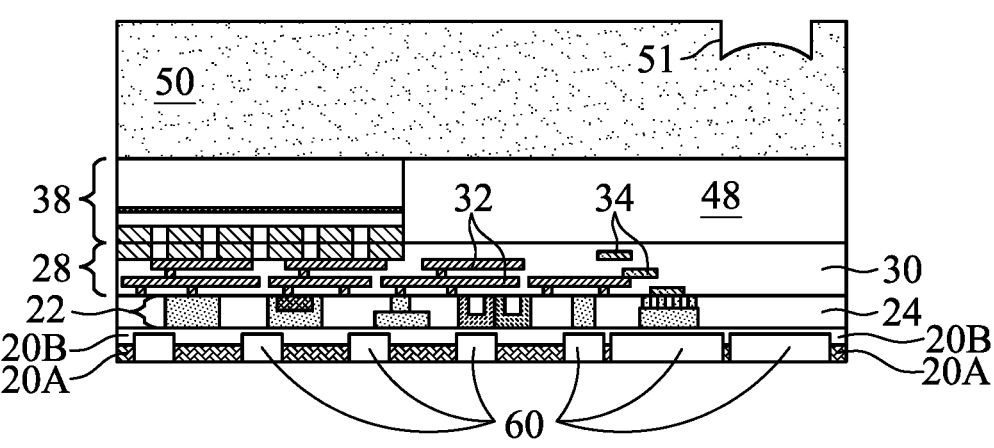
FIGS. 18-20, 21A, 21B, and 22-24 illustrate the intermediate stages in the formation of some packages with backside waveguides in accordance with some embodiments.

The initial steps of these embodiments are essentially the same as shown in FIGS. 1-8 and 10. The resulting structure is shown in FIG. 18. The reflector 58 as formed in FIG. 9 may be formed, or may be skipped in accordance with some embodiments. Semiconductor layer 20A has been thinned, with dielectric layer 20B being between semiconductor layer 20A and photonic devices 22. Dielectric regions 60 are formed, and are transparent to light.

Figure 19:
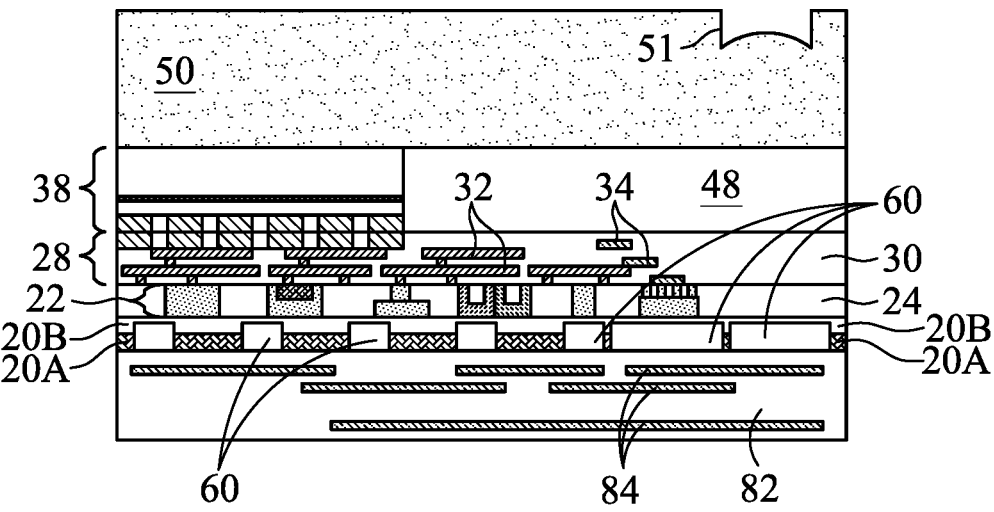

In subsequent processes, as shown in FIG. 19, dielectric layers 82 are formed, with nitride waveguides 84 being formed therein. The formation of nitride waveguides 84 that are at a same level may include a deposition process, followed by a patterning process through etching. The deposition process may include CVD, PECVD, Low-Pressure Chemical Vapor Deposition (LPCVD), PVD, or the like. Nitride waveguides 84 may be formed of or comprise silicon nitride, silicon oxynitride, or the like. Alternatively, instead of forming nitride waveguides 84, polymer waveguides may be formed.

Dielectric layers 82 may be formed of or comprise a light-transparent material(s) such as silicon oxide, a spin-on glass, or the like. Dielectric layers 82 may be formed using CVD, PVD, spin-on coating, or the like, while another process may be used. In accordance with some embodiments, a planarization process such as a CMP process or a mechanical grinding process is used to planarize each of dielectric layers 82. After the planarization process, a dielectric layer 82 may have a surface (the illustrated bottom surface) coplanar with a surface of the corresponding nitride waveguides 84. Alternatively, a dielectric layer 82 may be thicker than the corresponding nitride waveguides 84, so that after the planarization process, the nitride waveguides 84 are embedded in the corresponding dielectric layer 82.

Nitride waveguides 84 may be optically coupled to photonic devices 22 and waveguides 34 through light projection and/or through Evanescent coupling. Nitride waveguides 84 may also be optically inter-coupled through Evanescent coupling. In the Evanescent coupling, when two waveguides are parallel and adjacent to each other, the light in a first waveguide is gradually reduced in intensity along the extending direction of the first waveguide, and is gradually coupled into a second waveguide.

Figure 20:
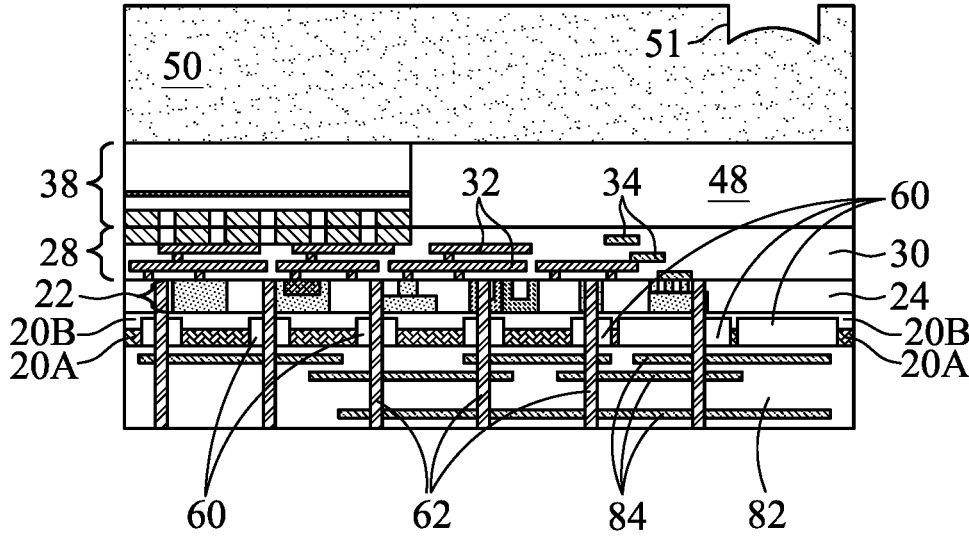
Figure 21A:
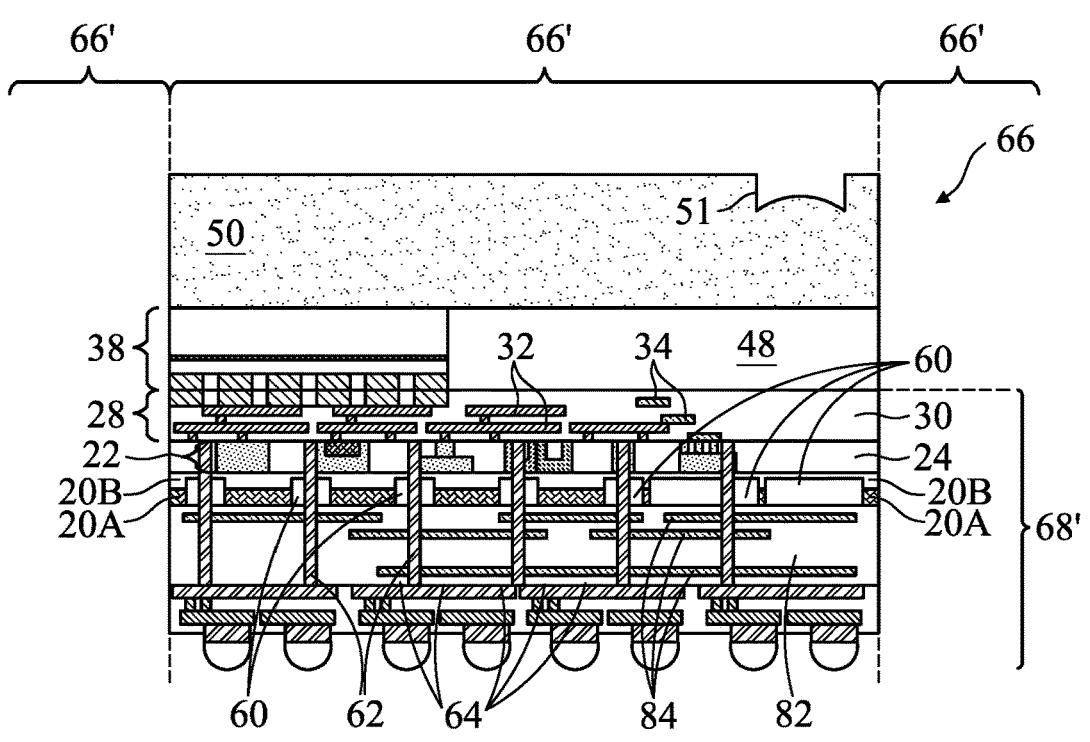
Figure 21B:
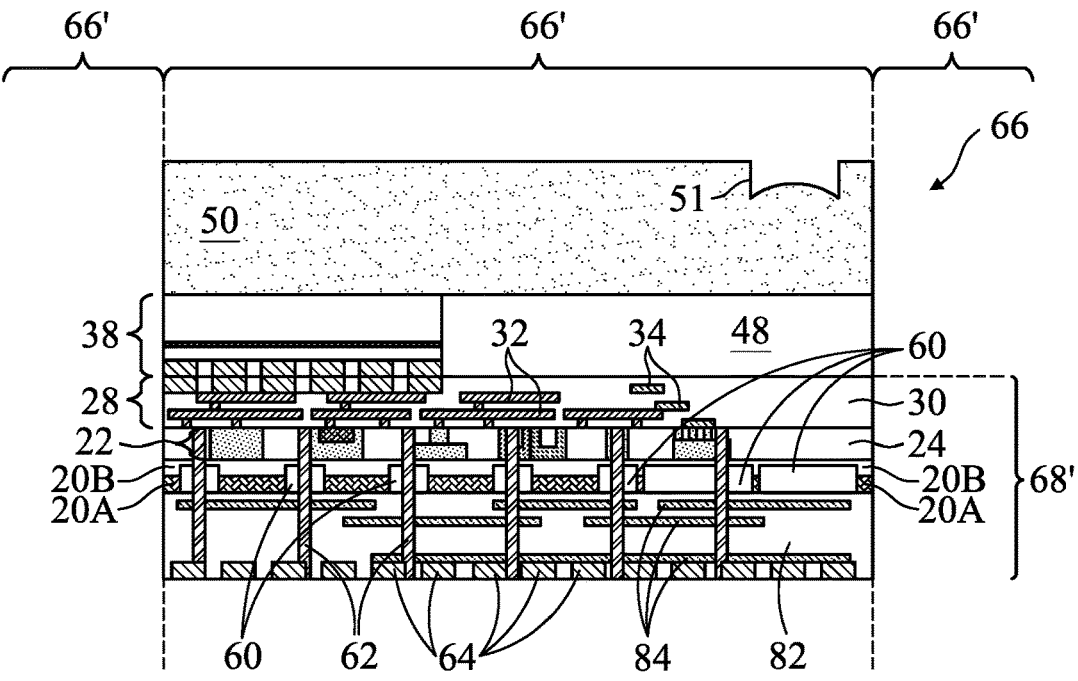

FIG. 20 illustrates the formation of through-vias 62, which penetrate through dielectric layers 82, 20B, and 24 and dielectric regions 60 to electrically connect to redistribution lines 32. FIGS. 21A and 21B illustrate the formation of electrical connectors 64 in accordance with various embodiments. Reconstructed wafer 66 is thus formed. In the embodiments shown in FIG. 21A, the electrical connectors 64 include metal pillars and solder regions, while in the embodiments shown in FIG. 21B, the electrical connectors 64 include bond pads that have surfaces coplanar with the surfaces of the respective dielectric layer. A singulation process is then performed to saw reconstructed wafer 66 into packages 66', which include optical engines.

Figure 22:
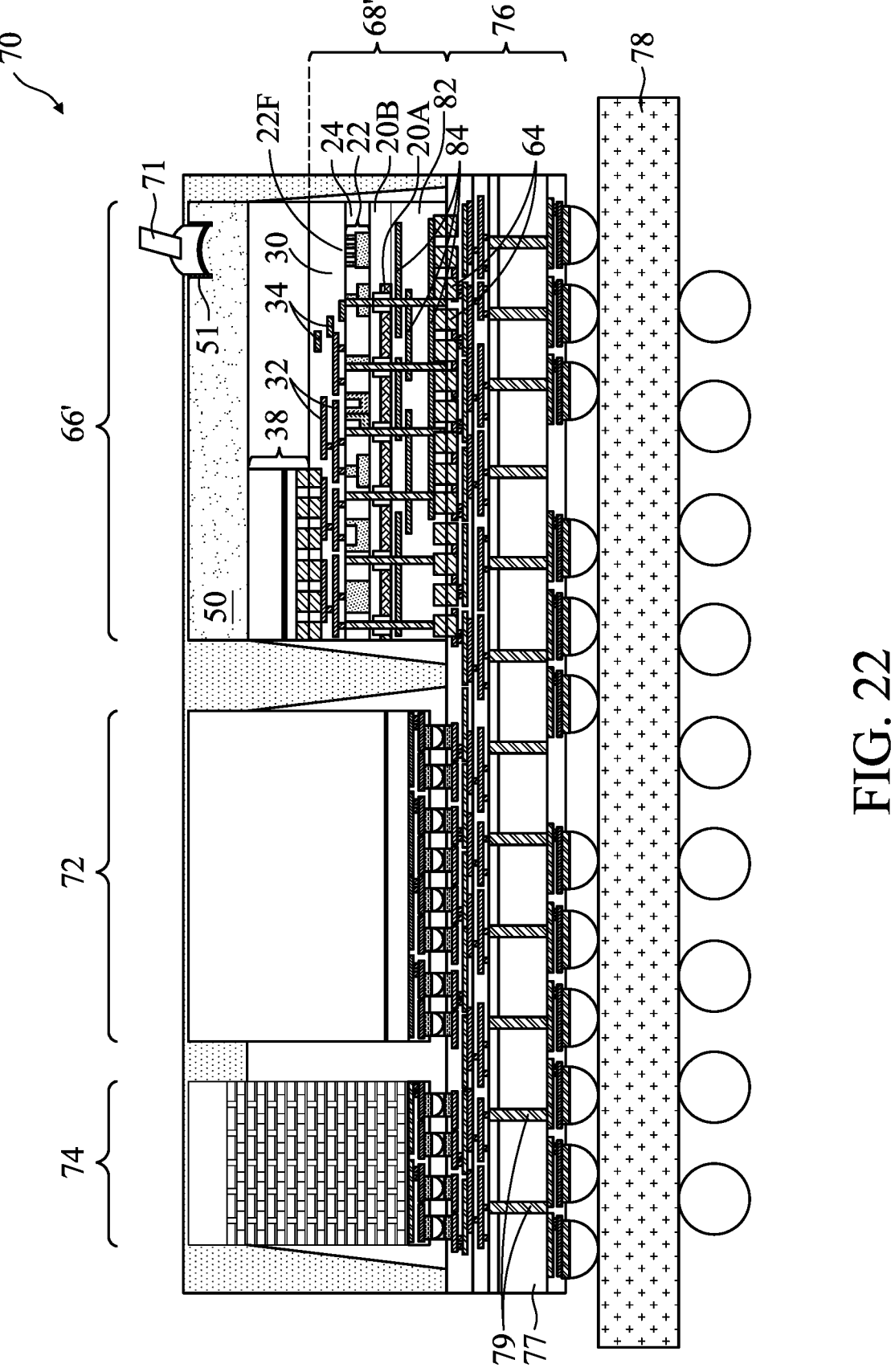
Figure 23:
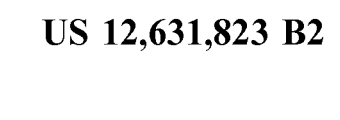
Figure 24:
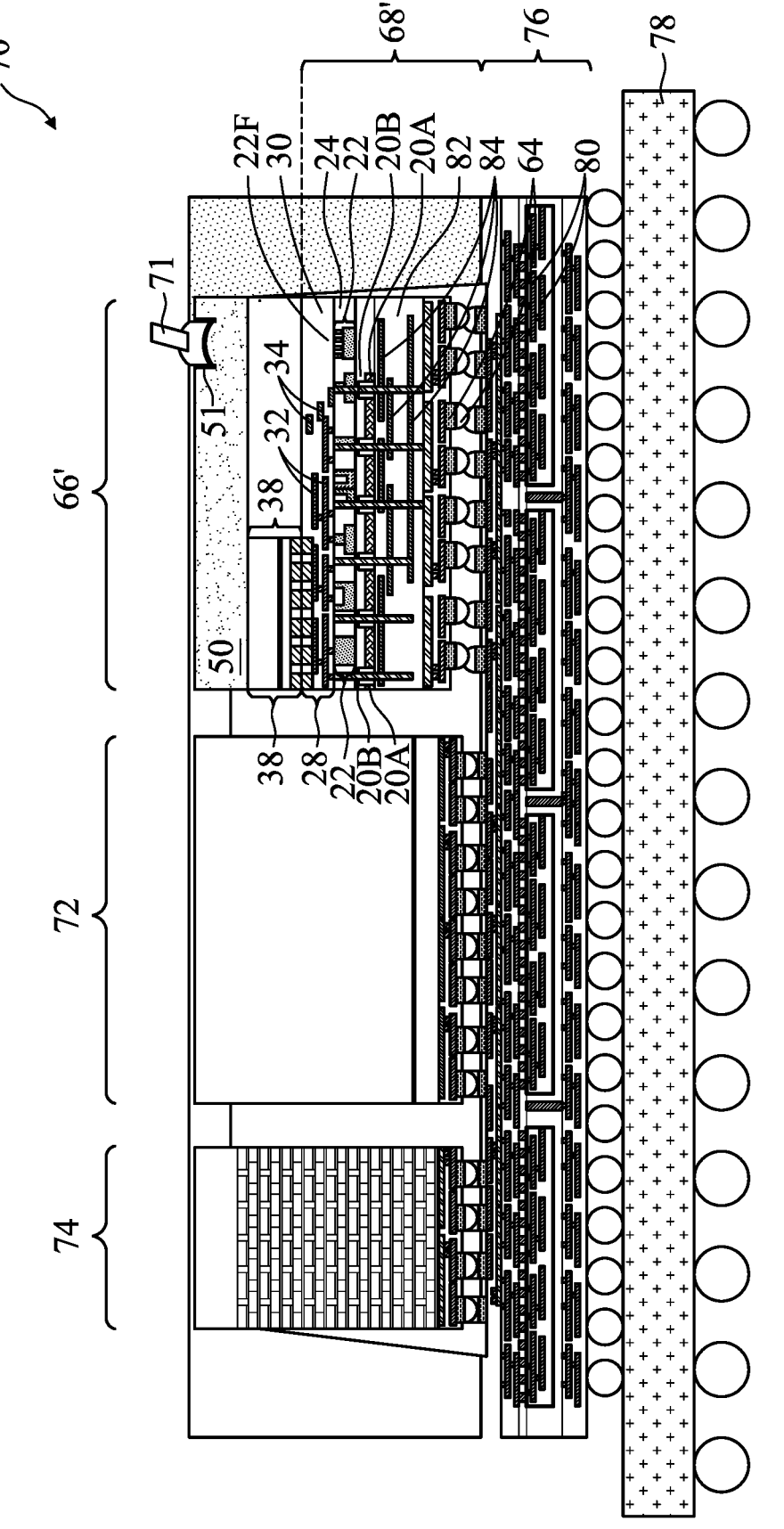

FIGS. 22, 23, and 24 illustrate the packages 70 formed accordance with various embodiments. The packages 70 in accordance with these embodiments are essentially the same as that shown in FIGS. 15, 16, and 17, respectively, except that the packages 70 in FIGS. 22, 23, and 24 include dielectric layers 82 and waveguides 84 formed on the backside of semiconductor layer 20A.

Figure 25:
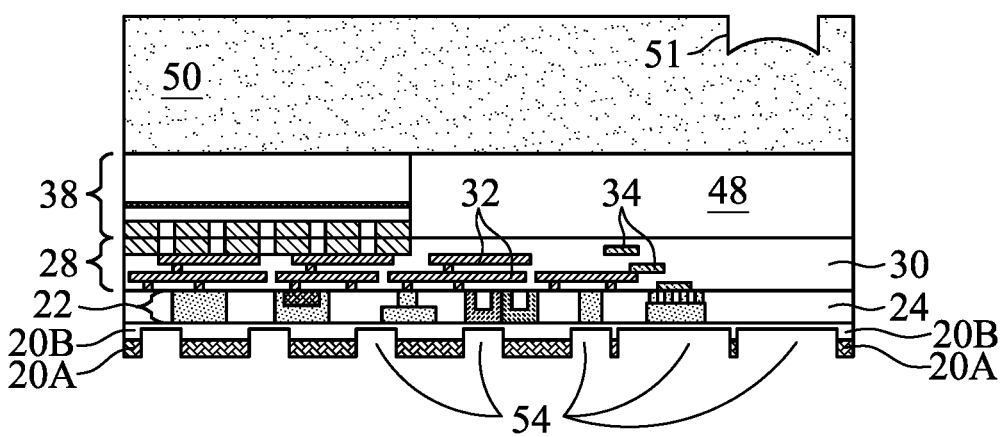
FIGS. 25-31, 32A, 32B, and 33-35 illustrate the intermediate stages in the formation of some packages with reflectors in accordance with some embodiments.
Figure 26:
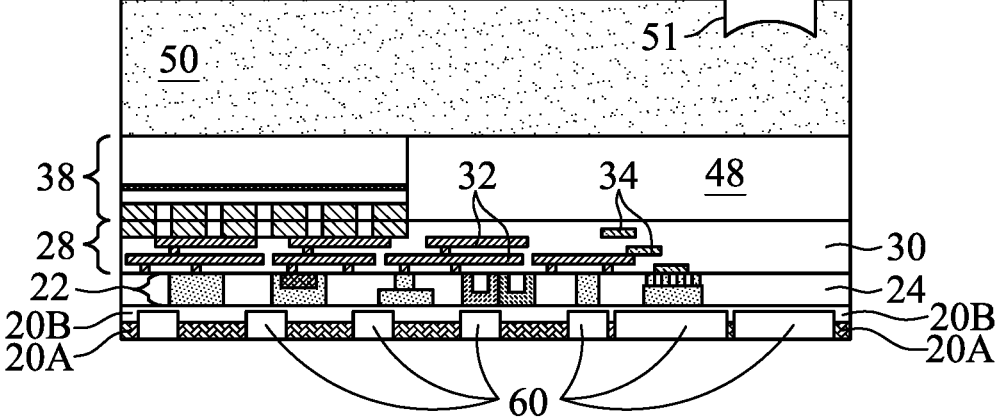
Figure 27:
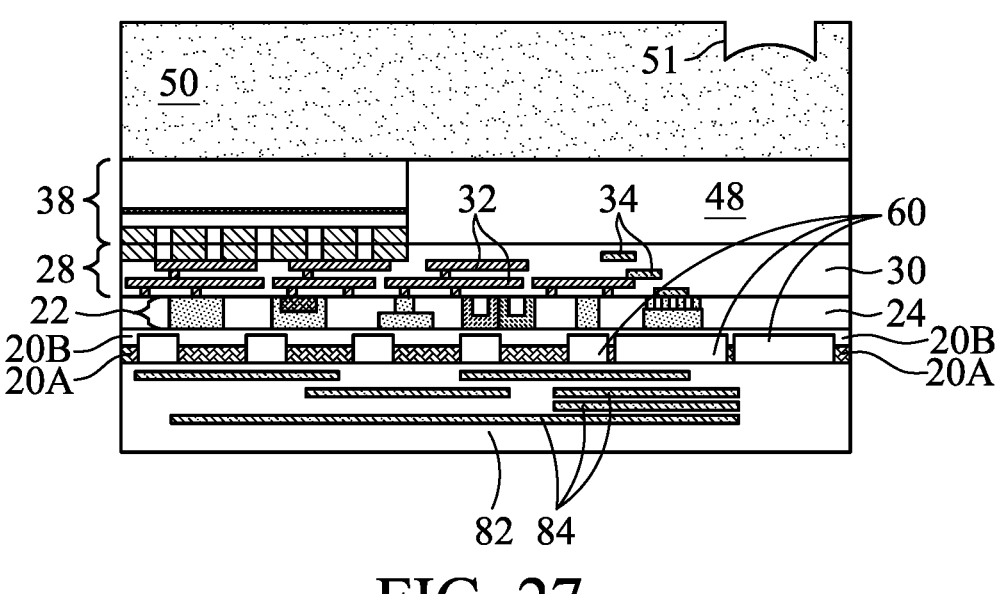

FIGS. 25-31, 32A, 32B, and 33-35 illustrate the intermediate stages in the formation of some packages including backside reflectors in accordance with some embodiments. The initial steps of these embodiments are essentially the same as shown in FIGS. 1-8 and 10. The resulting structure is shown in FIG. 25. The reflector 58 as formed in FIG. 9 may be formed, or may be skipped in accordance with these embodiments. Semiconductor layer 20A have been thinned, with dielectric layer 20B remaining also. Openings 54 are formed to penetrate through semiconductor layer 20A. Next, as shown in FIG. 26, dielectric regions 60 are formed to fill openings 54. In subsequent processes, as shown in FIG. 27, dielectric layers 82 and nitride waveguides 84 are formed.

Figure 28:
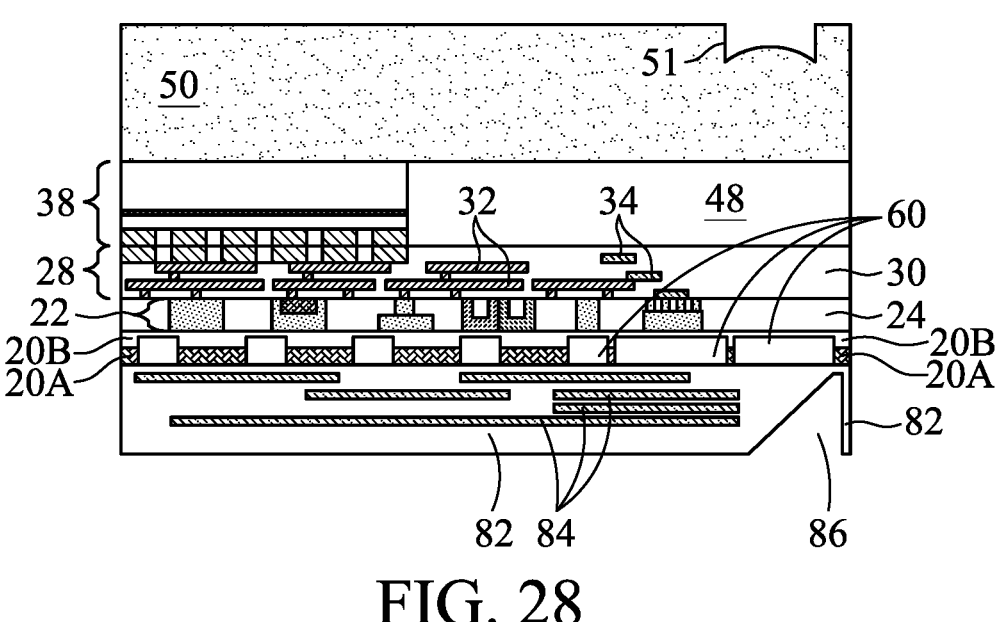
Figure 29:
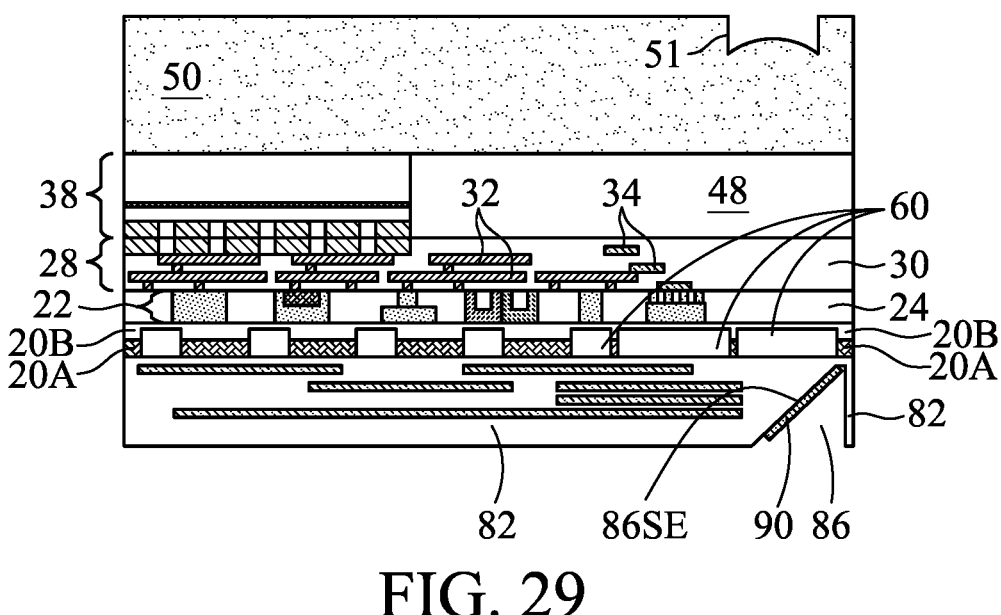

FIGS. 28 and 29 illustrate the formation of a recess in dielectric layers 82 and the formation of a reflector in the recess. The details in the formation of the recess and the reflector are shown in FIGS. 36 through 45 in accordance with various embodiments.

Figure 36:
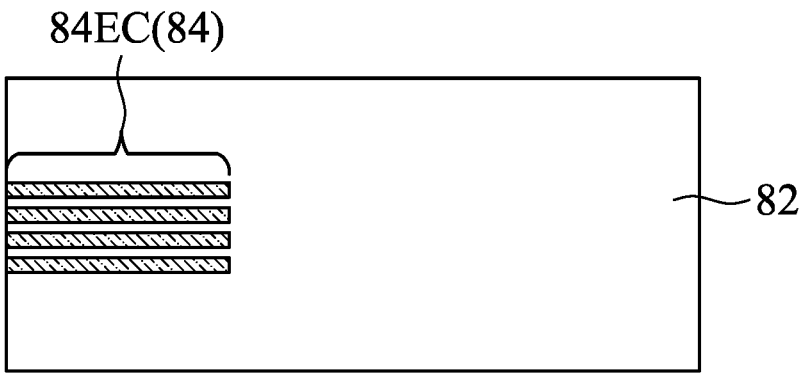
FIGS. 36-45 illustrate the intermediate stages in the formation of metal reflectors in accordance with some embodiments.

Referring to FIG. 28, recess 86 is formed by etching dielectric layer(s) 82. The processes for forming recess 86 is shown in FIGS. 36 through 39 in accordance with some embodiments, wherein magnified views are shown. Referring to FIG. 36, a portion of the region including waveguides 84 and the portions of dielectric layers 82 aside of waveguides 84 are shown. In accordance with some embodiments, a plurality of waveguides 84 are closely located to form an edge coupler 84EC. The plurality of waveguides 84 have an increased cross-section area than a single waveguide 84, so that it has an improved efficiency in collecting the light reflected from the reflector that is to be formed in subsequent processes.

Figure 37:
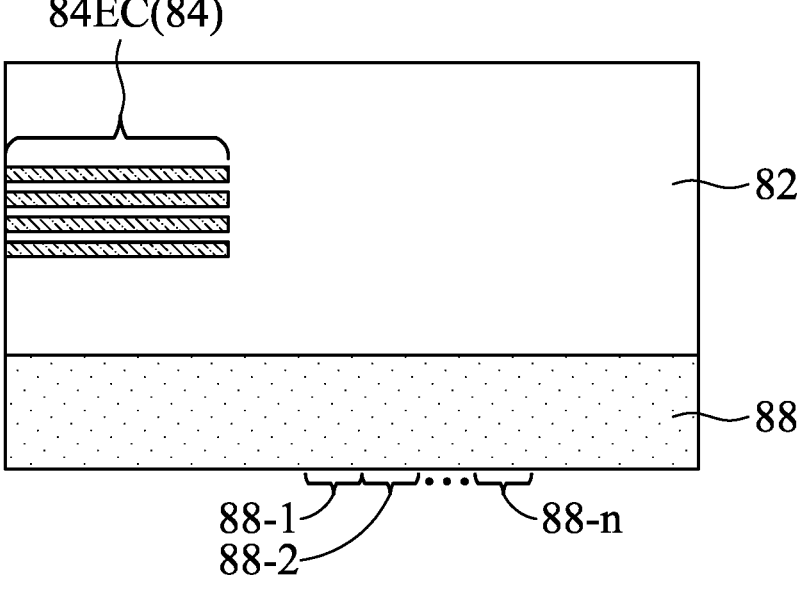

Referring to FIG. 37, photoresist 88 is formed on dielectric layer 82. It is appreciated that FIGS. 36 through 45 are shown with the same orientation as in FIGS. 28 and 29, while in actually processes, the structures shown in FIGS. 36 through 45 may be flipped upside-down during the formation of the recess.

Figure 38:
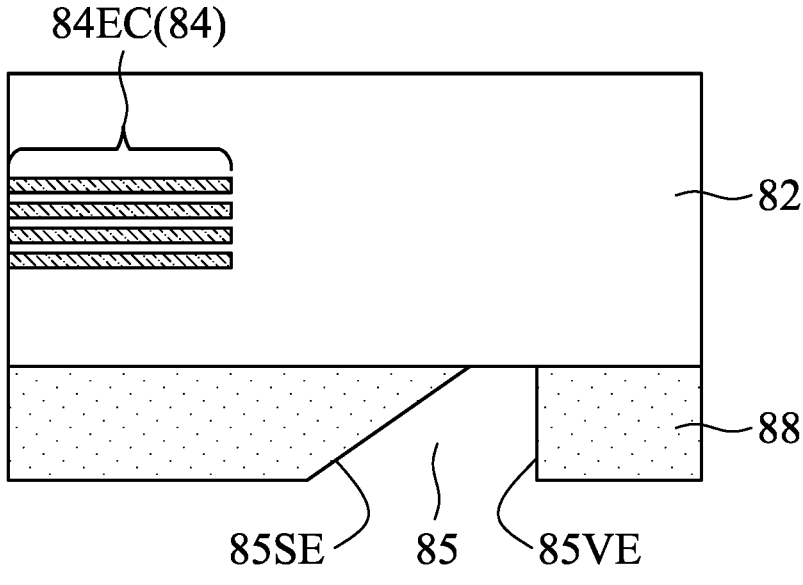

Referring to FIG. 38, photoresist 88 is patterned to form recess 85. In accordance with some embodiments, recess 85 has slant edge 85SE and vertical edge 85VE. When viewed in a perspective view, both of slant edge 85SE and vertical edge 85VE are flat surfaces. In accordance with some embodiments, the formation of the recess 86 having the illustrated profile may include performing a plurality of light-exposure processes, each for exposing a section of the photoresist 88, with different sections of photoresist 88 being light-exposed using different exposure time and different focus depths. For example, FIG. 37 illustrates sections 88-1, 88-2, . . . through 88-n, wherein integer n may be 3, 4, 5, or greater. From 88-1, 88-2, . . . through 88-n, the exposure durations, focus depths, and/or light intensities may gradually increase. As a result, sections 88-1, 88-2, . . . . through 88-n have gradually increased exposure, and after the development, the resulting photoresist 88 has the illustrated profile in FIG. 38.

Figure 39:
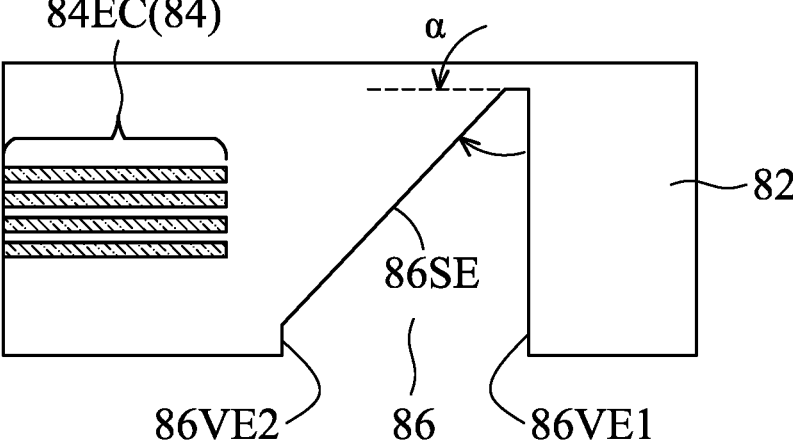

Next, dielectric layers 82 are etched using photoresist 88 as an etching mask, so that recess 86 (FIG. 39) is formed in dielectric layers 82. The etching is anisotropic. In accordance with some embodiments, in the etching process, photoresist 88 is also consumed gradually, and hence the profile of recess 85 in photoresist 88 is carried into dielectric layer 82. For example, as shown in FIG. 39, recess 86 may have slant edge 86SE and vertical edge 86VE1. Also, the tilting angle of slant edge 86SE may be adjusted by adjusting the ratio of the etching rate of dielectric layers 82 to the consumption rate of photoresist 88. After the etching process, the remaining portion of photoresist 88 is removed, and the resulting structure is shown in FIG. 39.

In accordance with some embodiments, when viewed in a perspective view, both of slant edge 86SE and vertical edge 86VE1 are flat surfaces. In the cross-sectional view, recess 86 has a triangular shape. The tilt angle α of slant edge 86SE may be in the range between about 30 degrees and about 60 degrees, and may be in the range between about 40 degrees and about 50 degrees. In accordance with some embodiments, the recess 86 in dielectric layers 82 may also have a vertical edge 86VE2. In accordance with alternative embodiments, vertical edge 86VE2 does not exist, and slant edge 86SE extends all the way to the bottom surface of dielectric layers 82. In accordance with some embodiments, the topmost end of recess 86 is higher than the topmost end of edge coupler 84EC, and is lower than semiconductor layer 20A (FIG. 28).

FIG. 29 illustrates the formation of reflector 90, which is formed on the slant edge 86SE. Reflector 90 may be formed of or comprise Cu, Al, Ta, AlCu, AlCuSi, or the like, alloys thereof, and/or multi-layers thereof. The formation process may include depositing a metal layer(s), and then patterning the metal layer to remove undesirable portions. In the resulting structure, the metal layer may not (or may) extend on vertical edges 86VE1 and 86VE2 (FIG. 39). Alternatively, there may be thinner and/or discontinuous portions of the metal layer on the vertical edges 86VE1 and 86VE2, while reflector 90 includes the continuous metal layer. A magnified view of reflector 90 is shown in FIG. 40.

Figure 30:
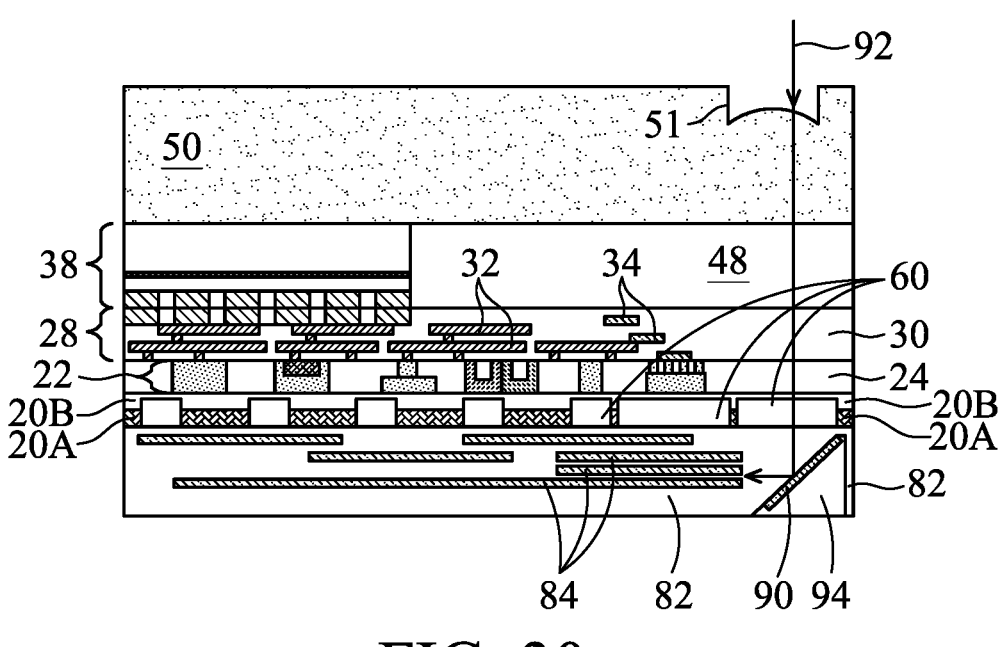
Figure 33:
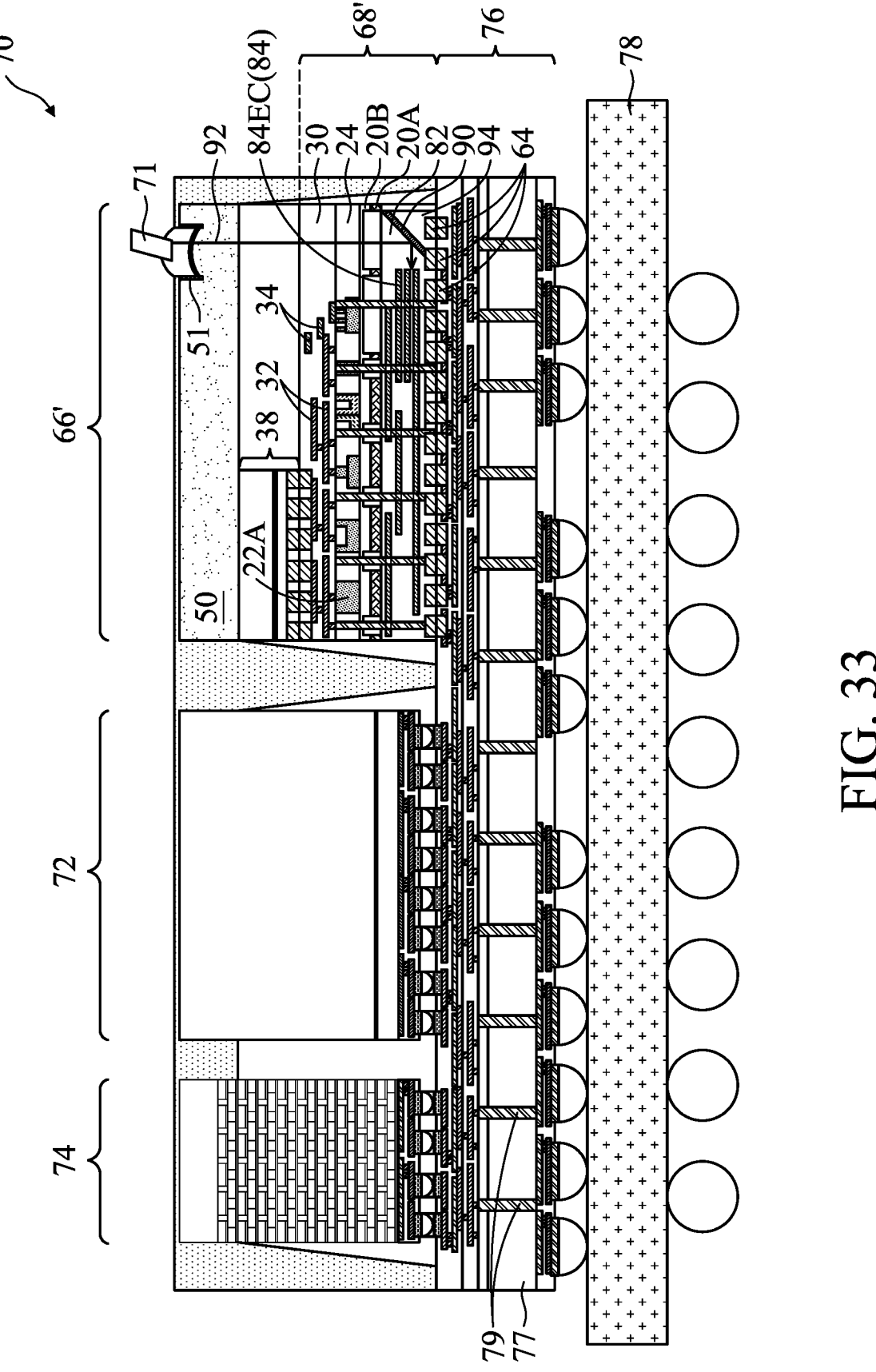

Reflector 90 is used for reflecting light. For example, as shown in FIGS. 30 and 33, when light beam 92 is projected from optical fiber 71 (FIG. 33) onto reflector 90, light beam 92 is reflected, and is projected on edge coupler 84EC as optical signals. The optical signals are transported through waveguides 84, and may be optically coupled to the waveguides in photonic devices 22, for example, through Evanescent coupling.

Figure 40:
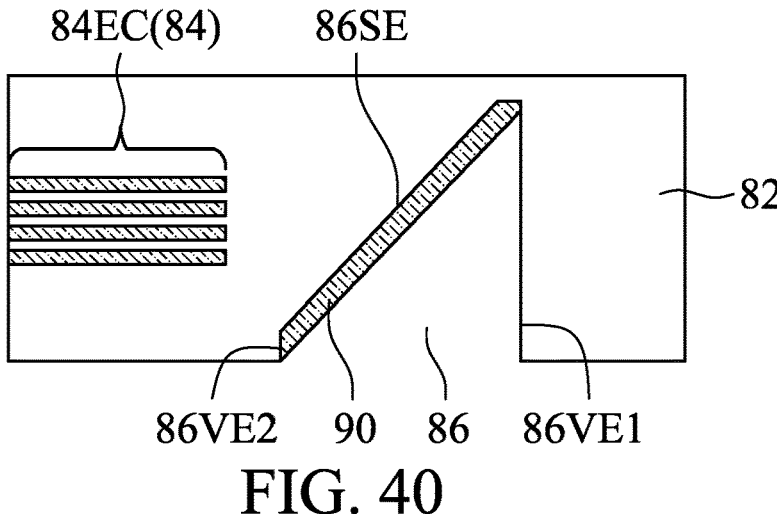
Figure 41:
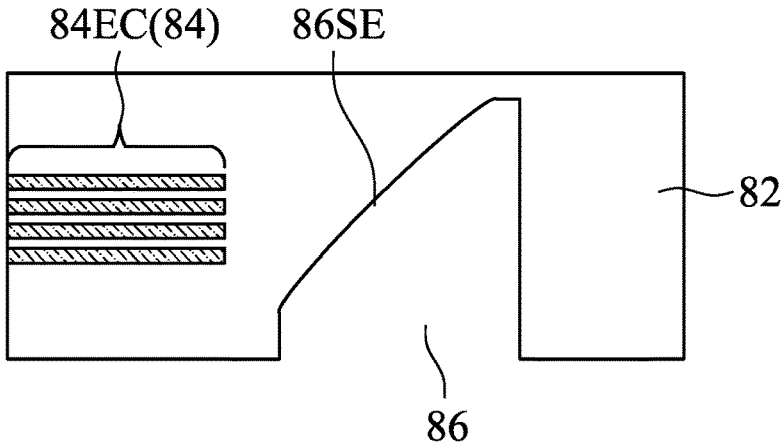
Figure 42:
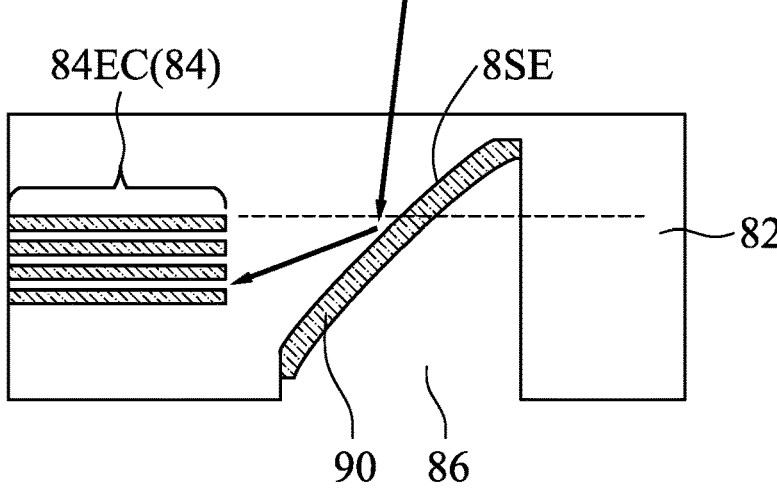
Figure 43:
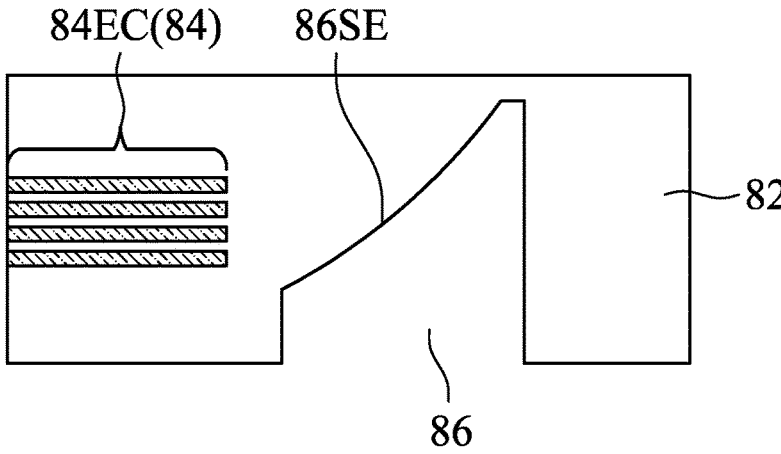
Figure 44:
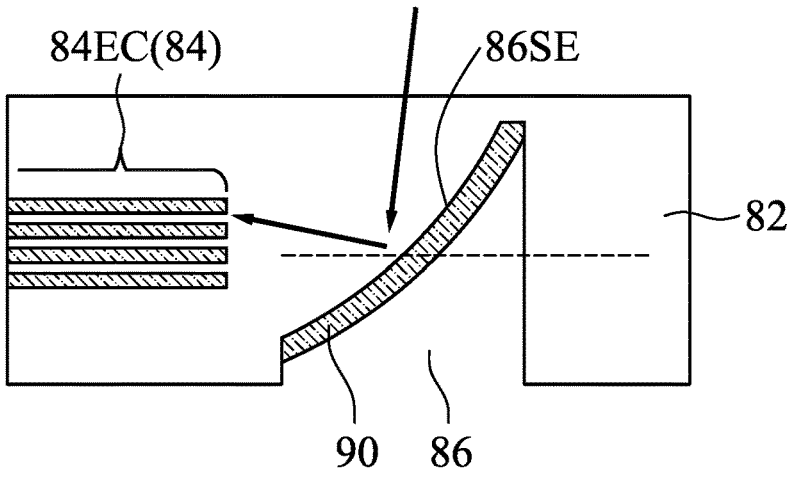
Figure 45:
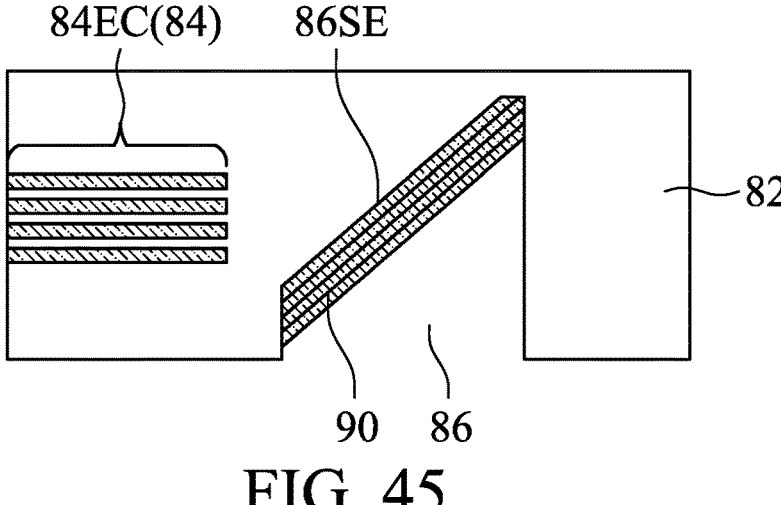

In accordance with some embodiments, as shown in FIG. 40, reflector 90 is planar. In accordance with alternative embodiments, as shown in FIG. 41, slant edge 86SE has a concave shape, which is continuously curved. The resulting reflector 90, as shown in FIG. 42, also has a concave shape, and is continuously curved. In accordance with yet alternative embodiments, as shown in FIG. 43, slant edge 86SE has a convex shape, which is continuously curved. The resulting reflector 90, as shown in FIG. 44, also has a convex shape, and is continuously curved. The profiles as shown in FIGS. 41 through 44 may be achieved, for example, by adjusting the profile of the recess 85 (FIG. 38), and by adjusting the process conditions in the etching of dielectric layers 82. FIG. 45 illustrates a structure in which reflector 90 includes a plurality of higher-refractive layers and a plurality of lower-refractive layers located alternatingly.

In accordance with yet alternative embodiments, instead of forming reflector 90 using a metallic material(s), reflector 90 may also be formed of a plurality of higher-refractive layers and lower-refractive layers, which are deposited alternatingly. For example, Si and SiN may be used to form a higher-refractive layer and a lower-refractive layer, respectively. Si and $SiO_2$ may be used to form a higher-refractive layer and a lower-refractive layer, respectively.

Next, referring to FIG. 30, dielectric region 94 is formed to fill the remaining recess 86. Dielectric layer 94 may be formed of or comprises an inorganic dielectric material or an organic dielectric material, which may include silicon oxide, silicon nitride, silicon oxynitride, silicon carbide, polyimide, Polybenzoxazoles (PBO), or the like. The formation process may include filling recess 86 with a dielectric material, and performing a planarization process to level the surfaces of dielectric layer 82 and dielectric region 94.

Figure 31:
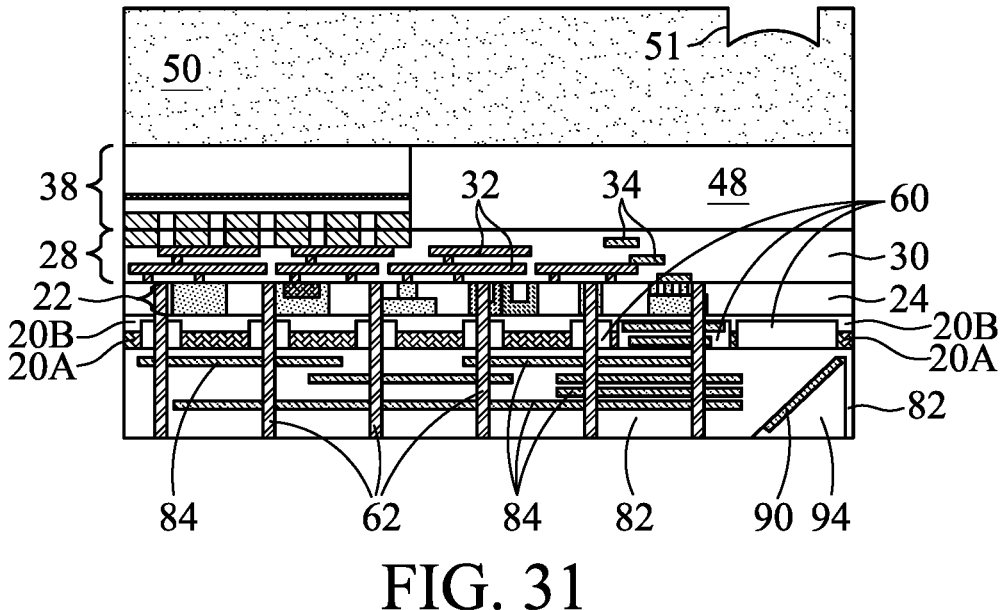
Figure 32A:
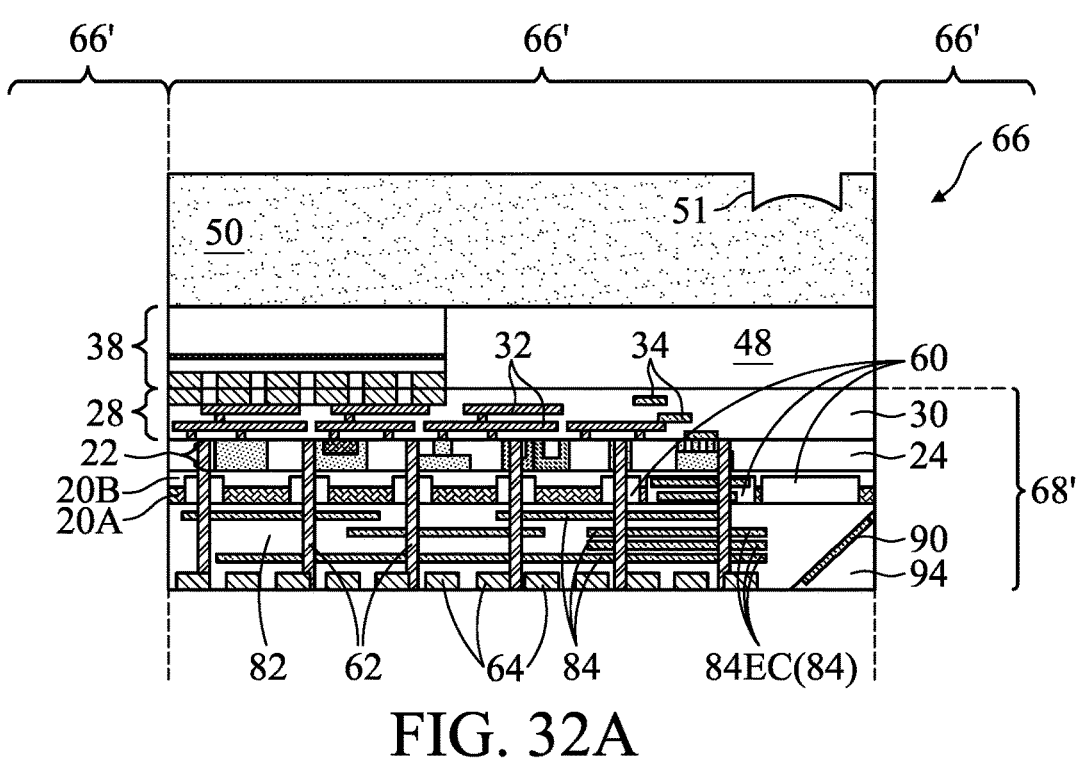
Figure 32B:
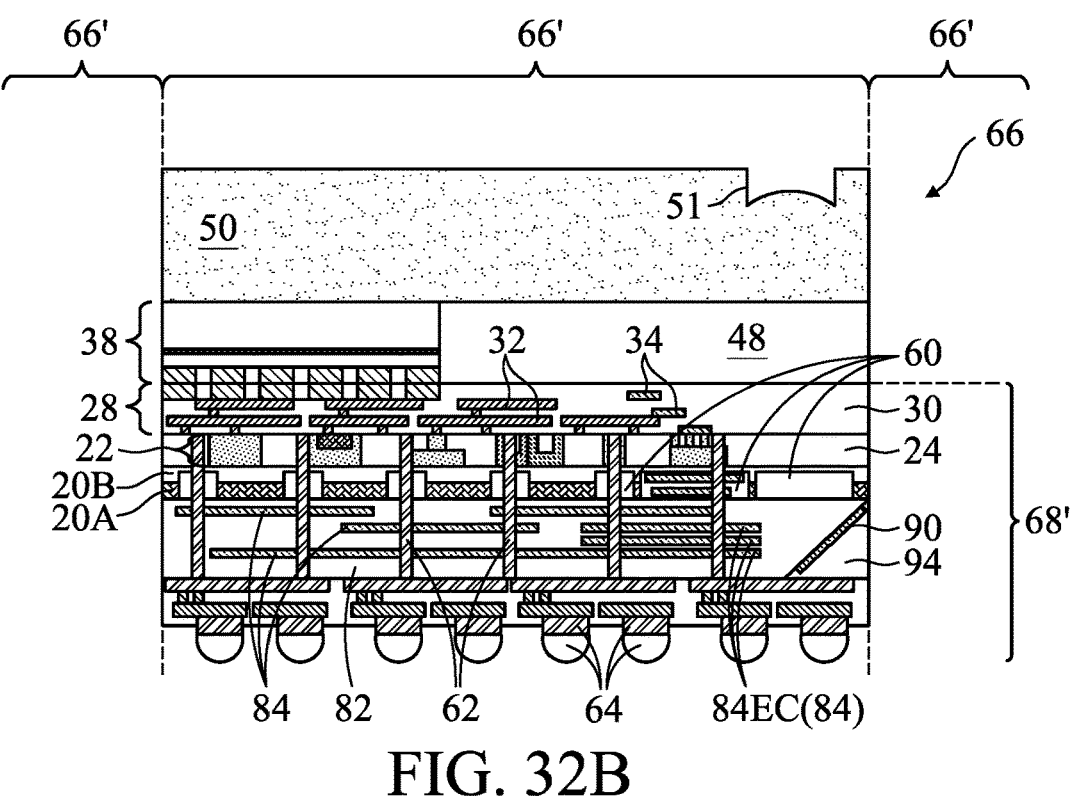

Referring to FIG. 31, through-vias 62 are formed. FIGS. 32A and 32B illustrate the formation of electrical connectors 64 in accordance with various embodiments. Reconstructed wafer 66 is thus formed. In the embodiments shown in FIG. 32A, the electrical connectors 64 include bond pads that are coplanar with the respective dielectric layer, while in the embodiments shown in FIG. 32B, the electrical connectors 64 include metal pillars and solder regions. A singulation process is then performed to saw reconstructed wafer 66 into packages 66', which include optical engines.

Figure 34:
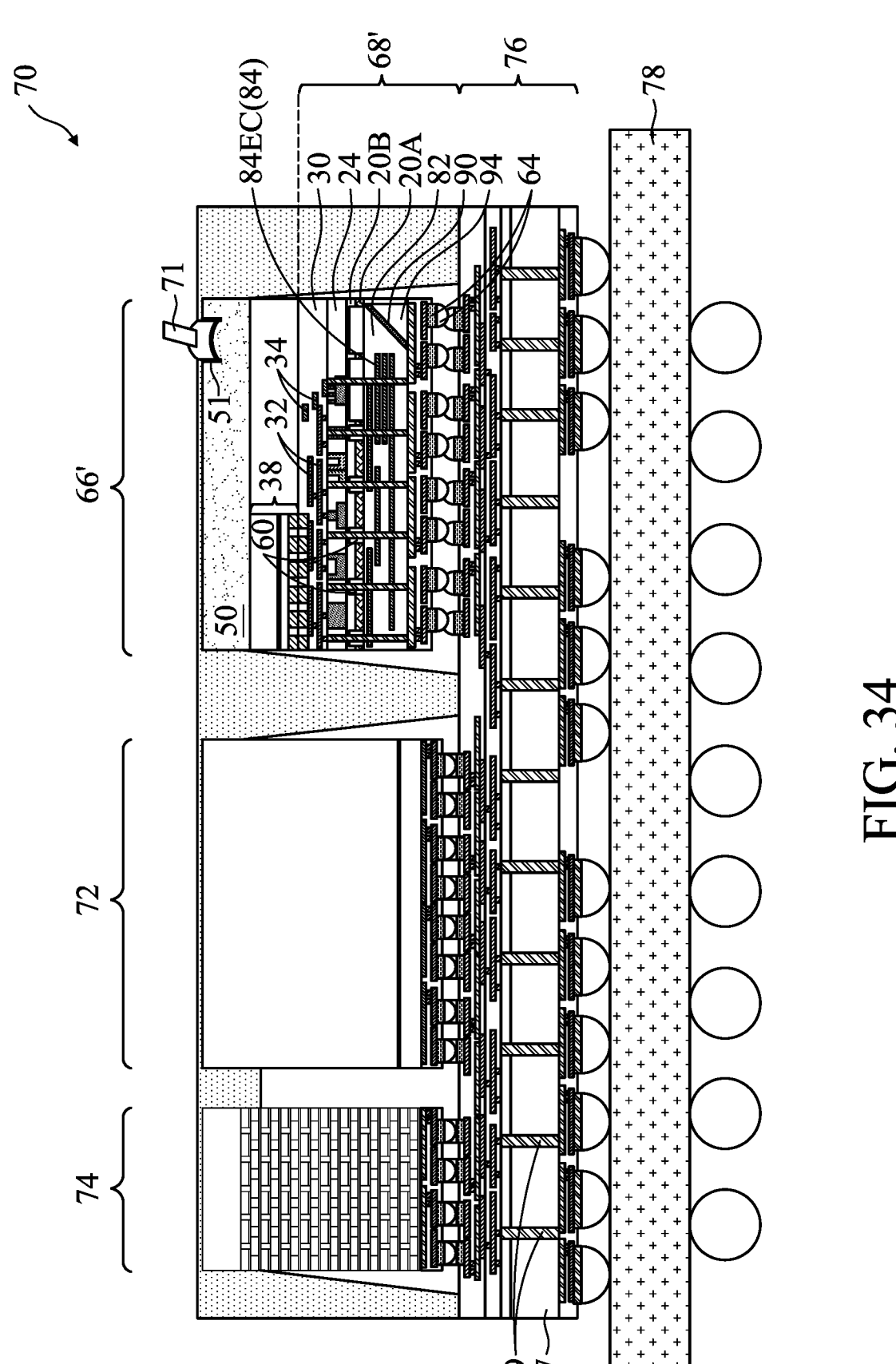
Figure 35:
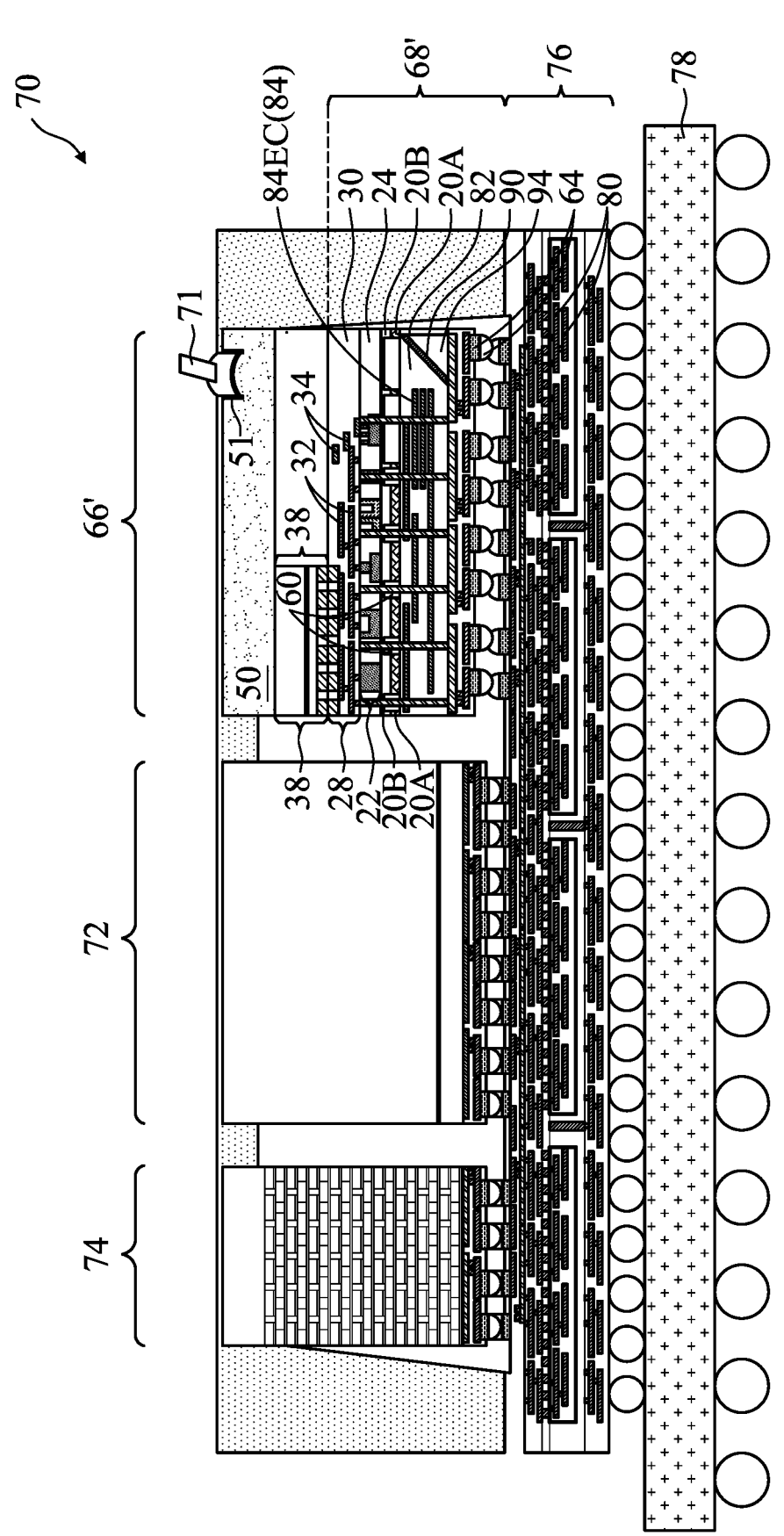

FIGS. 33, 34, and 35 illustrate the packages 70 that incorporate packages 66'. The packages 70 in accordance with these embodiments are essentially the same as that shown in FIGS. 22, 23, and 24, respectively, except that reflectors 90 are formed.

Figure 46A:
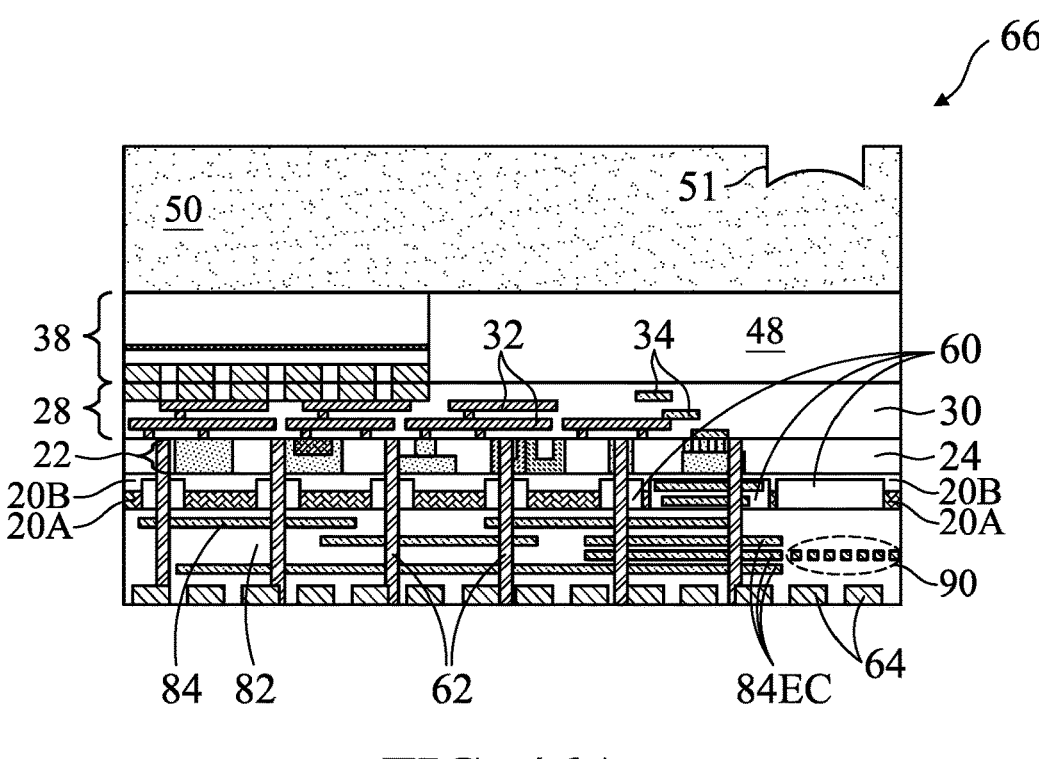
FIGS. 46A and 46B schematically illustrate the packages incorporating photonic crystals in accordance with some embodiments.
Figure 46B:
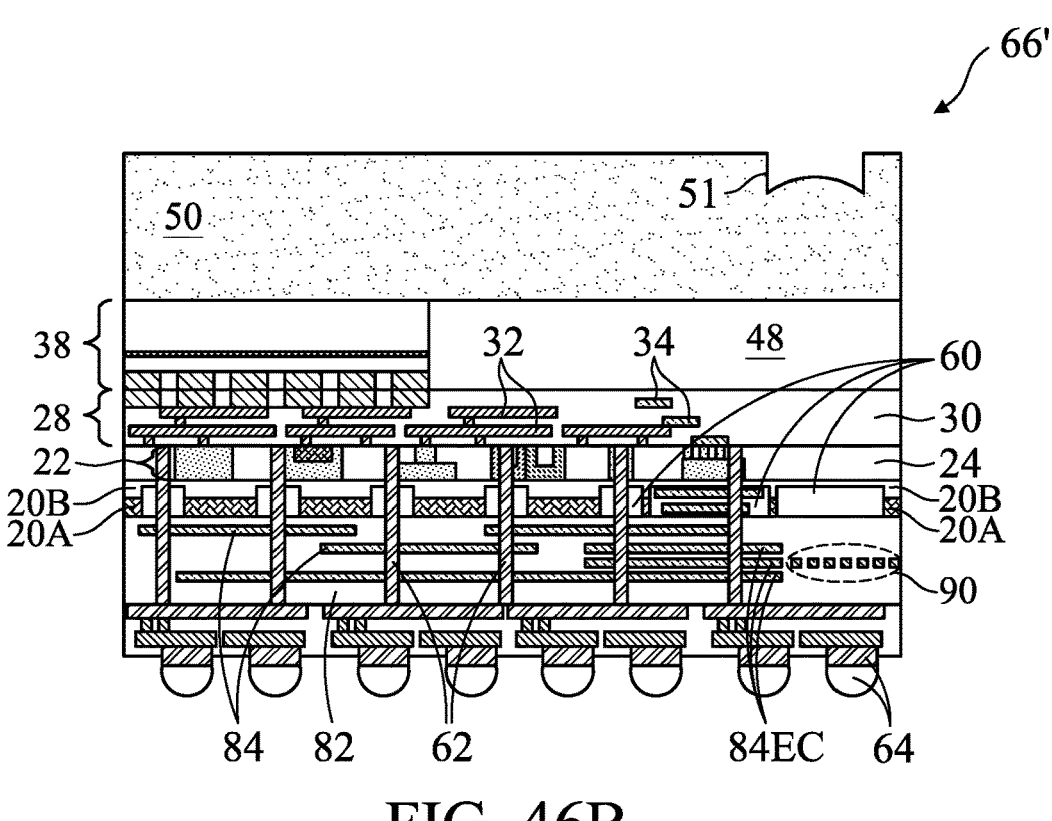

FIGS. 46A and 46B illustrate the packages 66' including reflectors 90, which include photonic crystals. The corresponding reflectors 90 are referred to as photonic-crystal reflectors 90 hereinafter. The photonic-crystal reflectors 90 in FIGS. 46A and 46B are schematically illustrated, and the detailed are shown in FIGS. 47 through 53. FIGS. 46A and 46B differ from each other in that in FIG. 46A, electrical connectors 64 include metal pads, while in FIG. 46B, electrical connectors 64 include metal pillars and solder regions.

Figure 47:
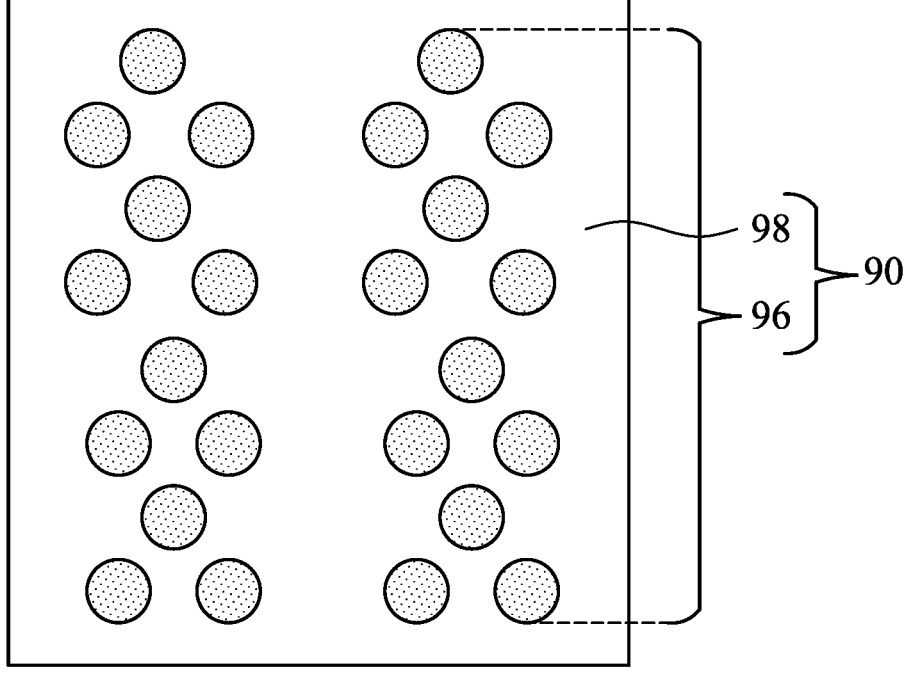
FIGS. 47-53 illustrate some reflectors incorporating photonic crystals and the formation processes of photonic crystals in accordance with some embodiments.

FIG. 47 illustrates a top view of photonic-crystal reflector 90 in accordance with some embodiments. Photonic-crystal reflector 90 includes a periodic structure of photonic crystals 96, which are surrounded by transparent material 98. Photonic crystals 96 have a periodic structure such as an array, a beehive pattern, or the like. Photonic crystals 96 and the surrounding transparent material 98 are formed of different materials and have different refractive indices. In accordance with some embodiments, photonic crystals 96 are formed of or comprise SiN, while transparent material 98 is formed of or comprises silicon oxide. The photonic-crystal reflector 90 uses super-prism effect to allow wide-angle deflection of light, wherein an incident light (into or out of the illustrated plane in FIG. 47) is deflected, and may be projected to edge coupler 84EC aside of photonic-crystal reflector 90.

Figure 48:
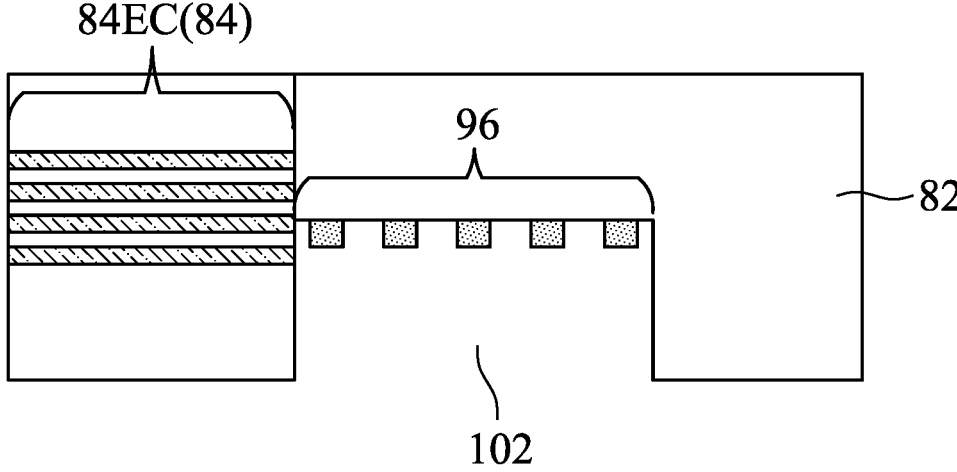
Figure 49:
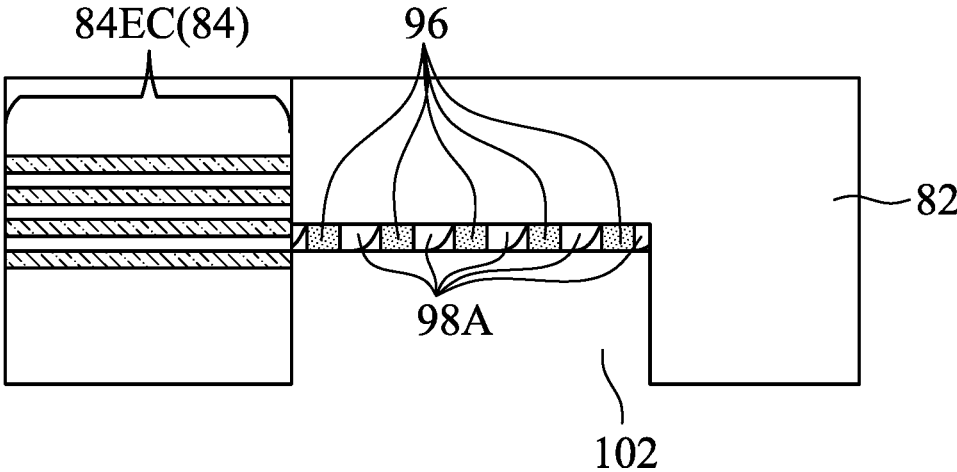
Figure 50:
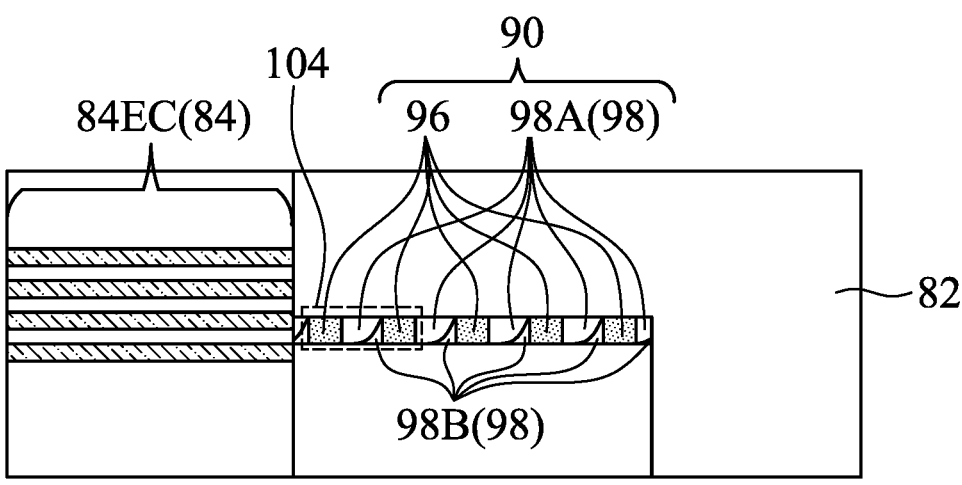

FIGS. 48 through 50 illustrate the cross-sectional views of intermediate stages in an example process for forming a photonic-crystal reflector 90 in accordance with some embodiments, wherein transparent material 98 have a gradient structure. Referring to FIG. 48, recess 102 is formed aside of edge coupler 84EC. The formation of recess 102 includes etching dielectric layers 82. Recess 102 extends to a level between a topmost surface and a bottommost surface of edge coupler 84EC. Photonic crystals 96 are then formed, for example, by depositing a SiN layer, and then patterning the SiN layer through a photolithography process. In accordance with some embodiments, photonic crystals 96 have cylindrical shapes, and hence are shown as round in the top view (FIG. 47), and have rectangular shapes in the cross-sectional view in FIG. 48.

Next, as shown in FIG. 49, SiON layer 98A is formed to partially fill the space between photonic crystals 96. In accordance with some embodiments, SiON layer 98A is formed using a blanket deposition process, followed by a patterning process.

Figure 51:
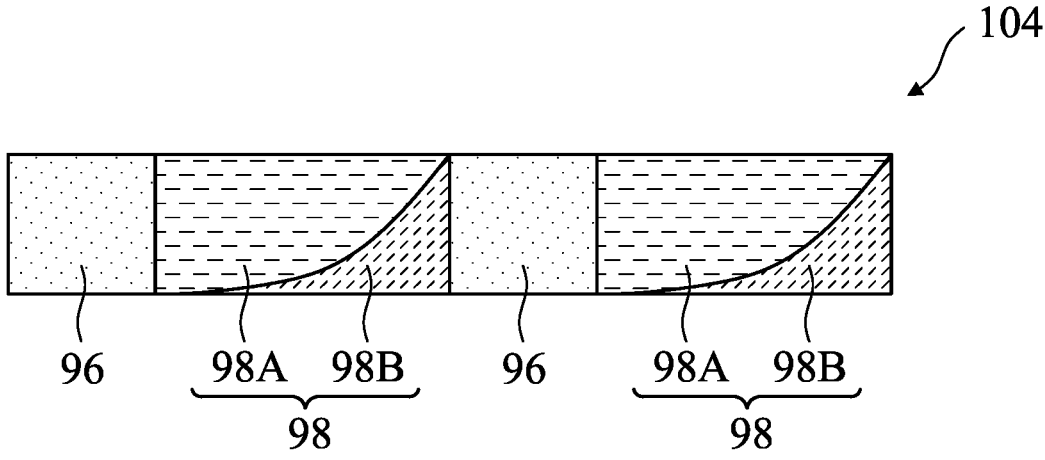

Next, as shown in FIG. 50, the remaining spacings between photonic crystals 96 is filled by $SiO_2$ regions 98B. SiON layer 98A and $SiO_2$ regions 98B collectively form transparent material 98. Since photonic crystals 96 have a period structure, in order to have the indiscriminative wavelength input, SiON, which has an refractive index in the middle of $SiO_2$ and SiN, is used as a gradient filler to allow the input wavelength to experience different effective periodicity. In accordance with other embodiments, the entire transparent material 98 is formed of a homogeneous material such as $SiO_2$. FIG. 51 schematically illustrates a magnified view of region 104 in FIG. 50.

Figure 52:
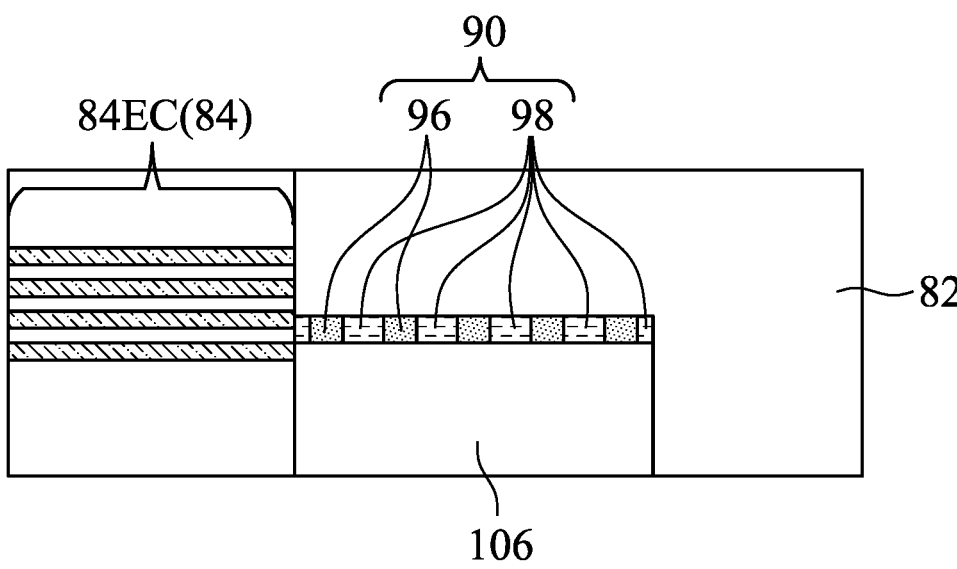
Figure 53:
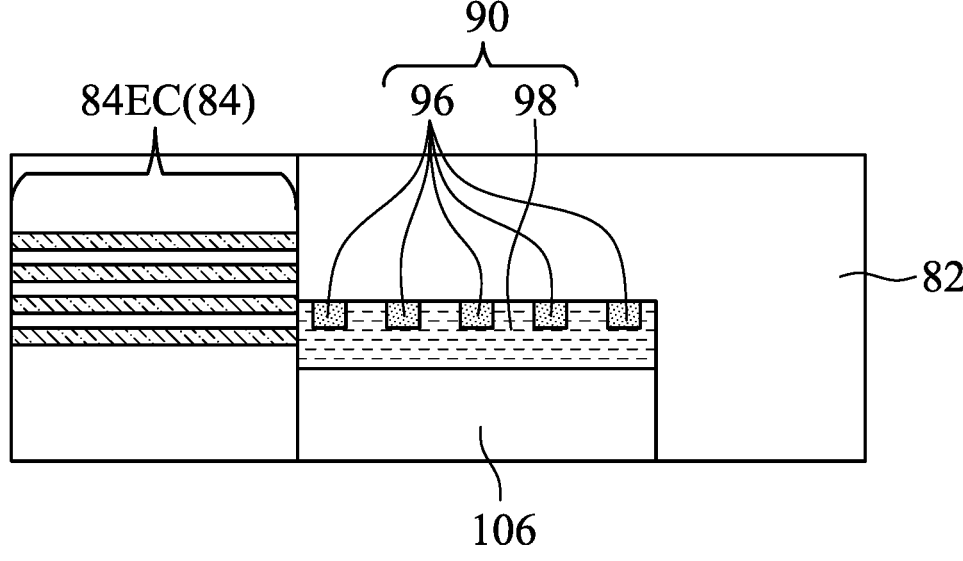

FIG. 52 illustrates reflector 90, in which the bottoms of photonic crystals 96 are at a same level as the bottom surface of transparent material 98 in accordance with some embodiments. FIG. 53 illustrates reflector 90, in which the bottoms of photonic crystals 96 are higher than the bottom surface of transparent material 98 in accordance with some embodiments. The region 106 underlying reflector 90 may be formed of dielectric filling materials such as silicon oxide, silicon carbide, silicon oxynitride, or the like.

Figure 54:
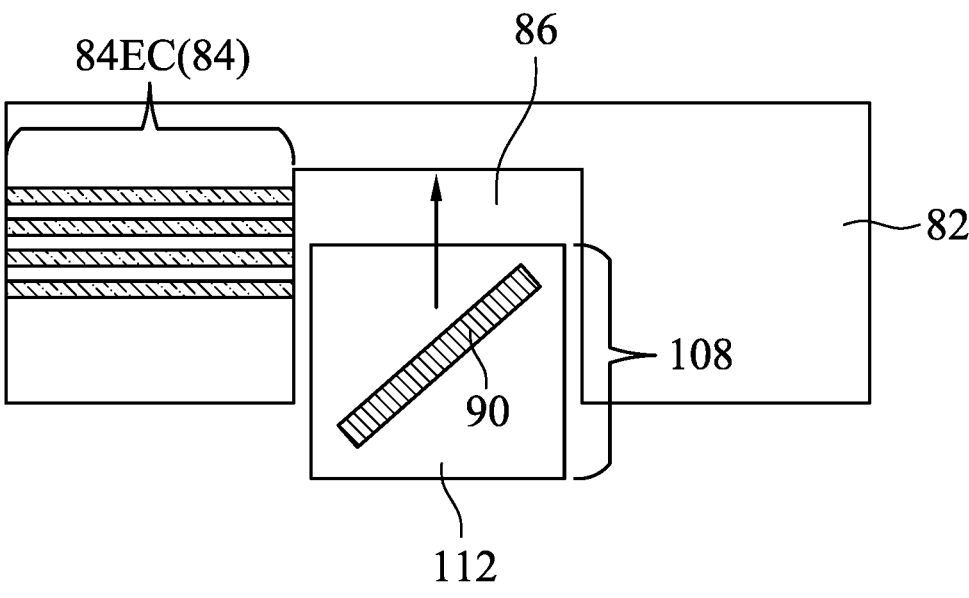
FIGS. 54-55 illustrate the placement of a pre-formed reflector in accordance with some embodiments.
Figure 55:
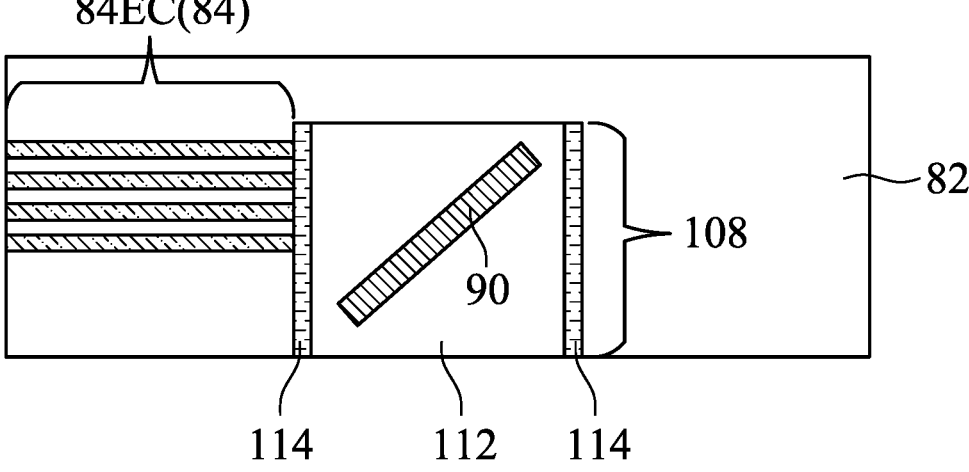

FIGS. 54 and 55 illustrate the cross-sectional views of intermediate stages in the formation of reflector 90 in accordance with some embodiments. The reflector 90 may be used to replace the reflectors as shown in FIGS. 22 through 35. Accordingly, the structures in FIGS. 33 through 35 may be formed, in which reflectors 90 have the structure as shown in FIG. 55 in accordance with alternative embodiments.

Referring to FIG. 54, recess 86 is formed, for example, by etching dielectric layers 82. Reflector block 108 is provided and includes reflector 90 and transparent block 112 enclosing reflector 90 therein. Reflector 90 may be formed of a metallic material or dielectric materials with alternating refractive indices, as discussed in preceding embodiments. Transparent block 112 may be formed of silicon oxide, SiON, or the like. Reflector block 108 is pre-formed to have the shape as shown in FIG. 54.

Next, as shown in FIG. 55, reflector block 108 is placed into recess 86, and may be bonded to dielectric layer 82, for example, through fusion bonding, wherein transparent block 112 is bonded with dielectric layers 82 to form Si—O—Si bonds. Dielectric filler 114, which is transparent, is then formed to fill the remaining recess 86. Dielectric filler 114 may be formed of or comprises SiN, $SiO_2$, $TiO_2$, or the like.

Figure 56A:
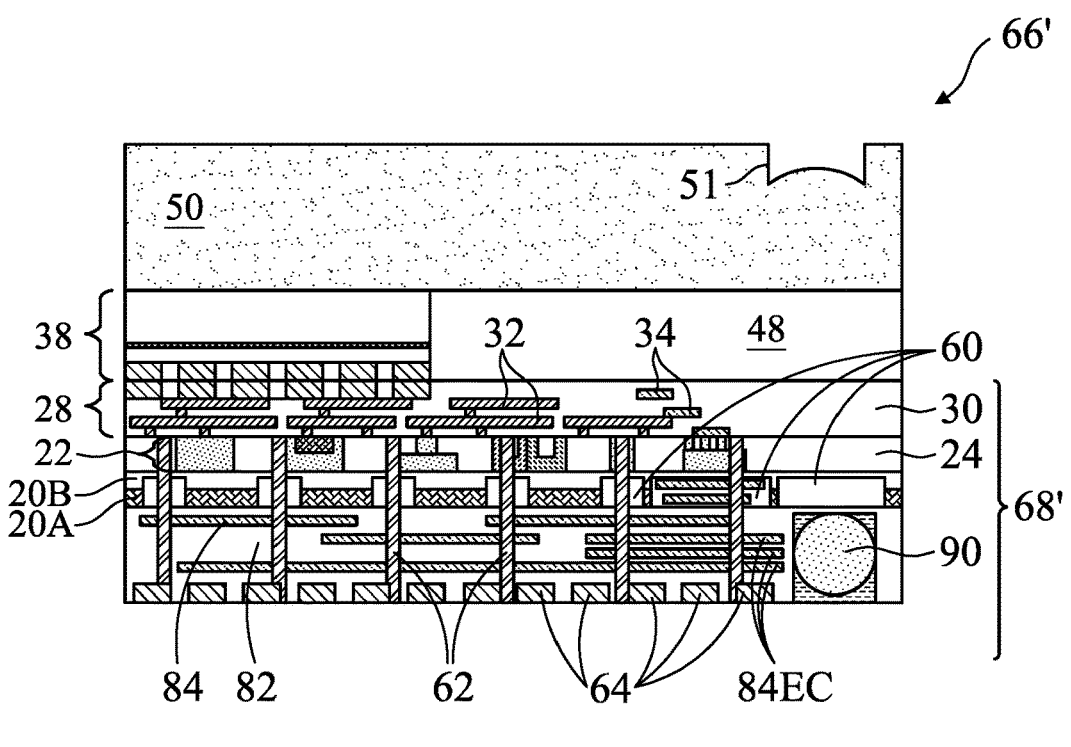
FIGS. 56A and 56B illustrate some packages with light-redirecting balls in accordance with some embodiments.
Figure 56B:
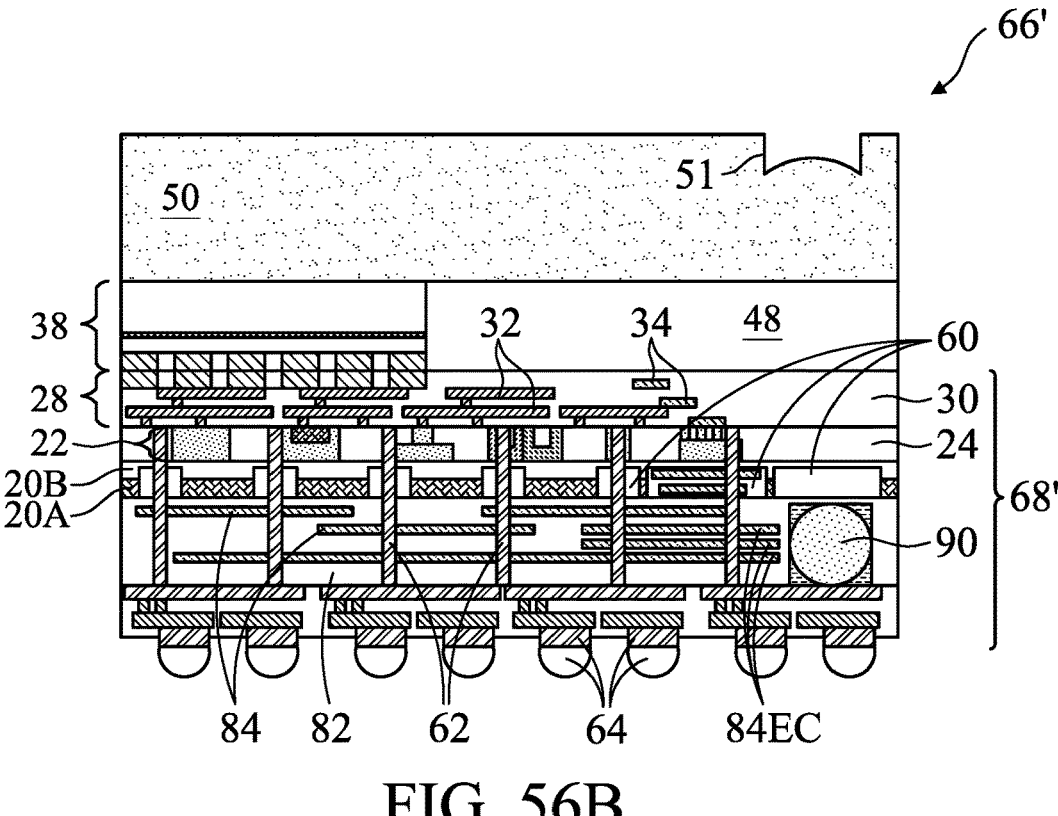

FIGS. 56A and 56B illustrate the packages 66' in accordance with alternative embodiments, wherein spherical reflectors 90 are adopted. FIGS. 56A and 56B differ from each other in that in FIG. 56A, electrical connectors 64 include metal pads, while in FIG. 56B, electrical connectors 64 include metal pillars and solder regions.

Figure 57:
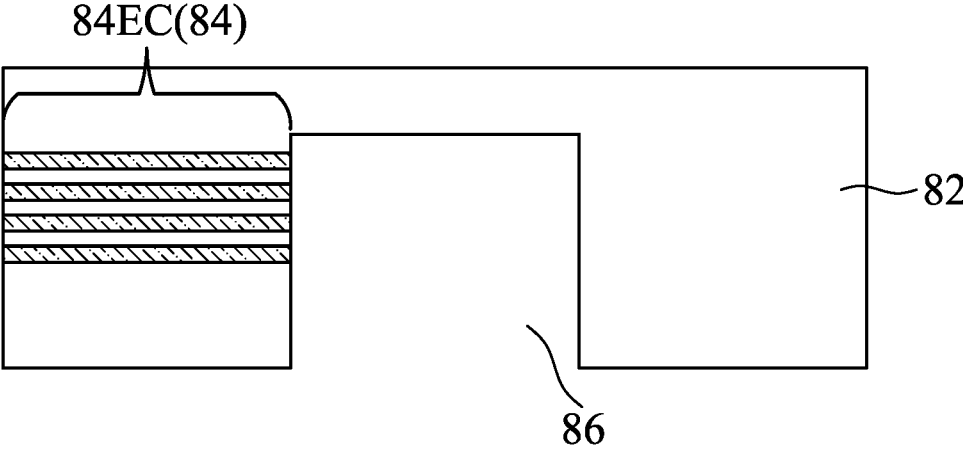
FIGS. 57-60 illustrate the formation processes of the packages with light-redirecting balls in accordance with some embodiments.
Figure 58:
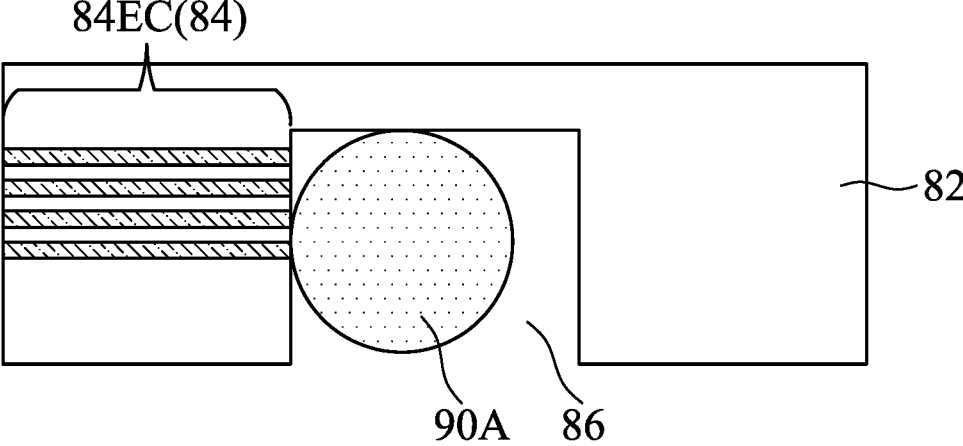
Figure 59:
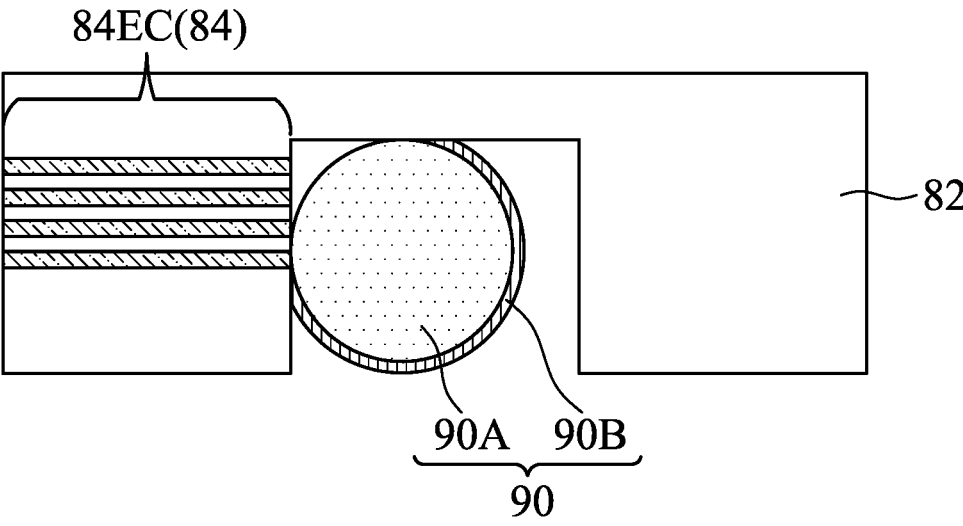
Figure 60:
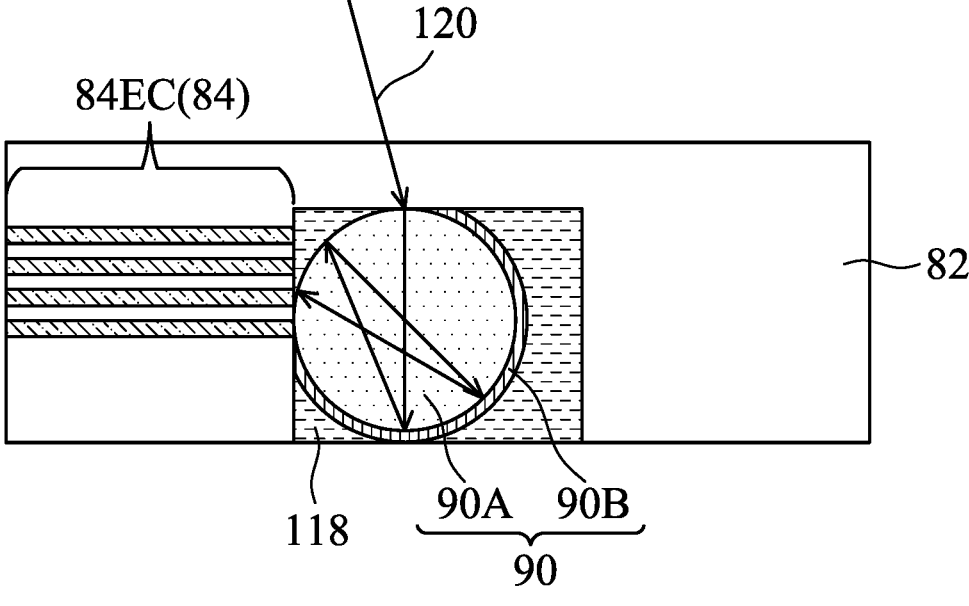

FIGS. 57 through 60 illustrate the cross-sectional views of intermediate stages in the formation of spherical reflector 90 in accordance with some embodiments. Referring to FIG. 57, recess 86 is formed, for example, by etching dielectric layers 82. Transparent ball 90A is then placed into recess 86, as shown in FIG. 58. Transparent ball 90A may be formed of $SiO_2$, quartz, silicon oxynitride, or the like. Transparent ball 90A contacts the sidewall of dielectric layers 82 facing recess 86. Transparent ball 90A may be in physical contact with edge coupler 84EC, or may be spaced apart from edge coupler 84EC by portions of dielectric layers 82. Furthermore, the illustrated top end of transparent ball 90A contact a bottom surface of one of dielectric layers 82.

Next, metal layer 90B is coated on the exposed surfaces of transparent ball 90A. The inner sides of transparent ball 90A facing edge coupler 84EC is not coated with metal layer 90B. The formation of metal layer 90B may include a deposition process such as PVD, followed by a patterning process. Metal layer 90B is reflective to light, and may be formed of or comprises Al, AlCu, AlCuSi, or the like. Transparent ball 90A and metal layer 90B collectively form reflector 90.

Filler 118 is then formed to fill the remaining recess 86. Filler 118 may be formed of or comprises an inorganic dielectric material or an organic dielectric material, which may include silicon oxide, silicon nitride, silicon oxynitride, silicon carbide, polyimide, PBO, or the like. The formation process may include filling recess 86 with a dielectric material, and performing a planarization process to level the surfaces of dielectric layer 82 and filler 118.

When a light beam is projected on reflector 90, for example, from optical lens 51 in FIG. 56A or 56B, the light beam 120 enters into reflector 90, and may be reflected by metal layer 90B. Light beam 120 may be reflected one or more times inside transparent ball 90A, and is eventually projected on and collected by edge coupler 84EC.

In accordance with the embodiments of the present disclosure, semiconductor layer 20A in the packages 66' do not have electrical functions, and may not be used for forming any electrical devices. In accordance with some embodiments, semiconductor layer 20A is electrically floating.

The embodiments of the present disclosure have some advantageous features. Silicon photonic devices are formed from a top silicon layer in the SOI substrate. By keeping a thin layer of a bottom semiconductor layer in the SOI substrate, the remaining bottom semiconductor layer and a dielectric layer thereon may protect the silicon photonic devices from being damaged by subsequent mechanical processes. For example, if the bottom semiconductor layer and the dielectric layer are removed by a polishing process, the polishing process may damage the silicon photonic devices. Also, waveguides and reflectors may be formed inside or underlying the thinned bottom semiconductor layer. Optical signals may be inter-coupled between the waveguides over the thinned bottom dielectric layer and the waveguides underlying the thinned bottom dielectric layer through Evanescent coupling.

In accordance with some embodiments of the present disclosure, a method comprises patterning a top silicon layer in a substrate to form a plurality of photonic devices, wherein the substrate comprises the top silicon layer, a first dielectric layer under the top silicon layer, and a semiconductor layer under the first dielectric layer; forming a second dielectric layer to embed the plurality of photonic devices therein; forming an interconnect structure over and signally coupling to the plurality of photonic devices; bonding an electronic die to the interconnect structure; thinning the semiconductor layer; patterning the semiconductor layer that has been thinned to form openings; filling the openings with a dielectric material to form dielectric regions; and forming through-vias penetrating through the dielectric regions to electrically couple to the interconnect structure.

In an embodiment, the method further comprises, after the semiconductor layer is thinned, forming waveguides optically coupled to the photonic devices, wherein the waveguides are formed on an opposite side of the semiconductor layer than the photonic devices. In an embodiment, the method further comprises forming a reflector in one of the openings in the semiconductor layer. In an embodiment, the reflector contacts the first dielectric layer. In an embodiment, the method further comprises bonding a supporting substrate over the electronic die.

In an embodiment, the supporting substrate comprises an optical lens. In an embodiment, the method further comprises forming a third dielectric layer, wherein the third dielectric layer is on an opposite side of the semiconductor layer than the photonic devices; and forming a reflector extending into the third dielectric layer. In an embodiment, the forming the reflector comprises etching the third dielectric layer to form a recess in the third dielectric layer; and depositing a metal layer into the recess. In an embodiment, the forming the reflector comprises etching the third dielectric layer to form a recess in the third dielectric layer; and placing a pre-formed reflector block in the recess, wherein the pre-formed reflector block comprises a slant metal layer, and a transparent material embedding the slant metal layer therein.

In an embodiment, the forming the reflector comprises etching the third dielectric layer to form a recess in the third dielectric layer; and forming optical crystals in the third dielectric layer, wherein the optical crystals have a periodic pattern. In an embodiment, the forming the reflector comprises etching the third dielectric layer to form a recess in the third dielectric layer; and placing a transparent ball in the recess.

In accordance with some embodiments of the present disclosure, a package comprises a photonic die comprising a plurality of photonic devices; an interconnect structure overlying the plurality of photonic devices, the interconnect structure comprising a plurality of redistribution lines therein; a semiconductor layer underlying the plurality of photonic devices; a dielectric region in the semiconductor layer; and a through-via penetrating through the semiconductor layer, wherein the dielectric region separates the through-via from the semiconductor layer; and an electronic die over and bonding to the photonic die. In an embodiment, the package further comprises a supporting substrate over and bonding to the electronic die.

In an embodiment, the package further comprises a reflector in the semiconductor layer. In an embodiment, the reflector comprises a first plurality of dielectric layers having a first refractive index; and a second plurality of dielectric layers having a second refractive index, wherein the first plurality of dielectric layers and the second plurality of dielectric layers are located alternatingly. In an embodiment, the package further comprises a dielectric layer underlying the semiconductor layer; and a waveguide in the dielectric layer. In an embodiment, the package further comprises a reflector underlying the semiconductor layer and extending into the dielectric layer, wherein the reflector is optically coupled to the waveguide.

In accordance with some embodiments of the present disclosure, a package comprises a photonic die comprising a silicon waveguide; an oxide layer underlying the silicon waveguide; a silicon layer underlying the oxide layer; and a nitride waveguide underlying the silicon layer, wherein the nitride waveguide is optically coupled to the silicon waveguide; and an electronic die over and bonding to the photonic die. In an embodiment, the oxide layer comprises a first top surface in physical contact with a first bottom surface of the silicon waveguide; and a second bottom surface in physical contact with a second top surface of the silicon layer. In an embodiment, the package further comprises a reflector extending into the silicon layer, wherein a top surface of the reflector contacts a bottom surface of the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

patterning a top silicon layer in a substrate to form a plurality of photonic devices, wherein the substrate comprises the top silicon layer, a first dielectric layer under the top silicon layer, and a semiconductor layer under the first dielectric layer;

forming a second dielectric layer to embed the plurality of photonic devices therein;

forming an interconnect structure over and signally coupled to the plurality of photonic devices;

bonding an electronic die to the interconnect structure;

thinning the semiconductor layer;

patterning the semiconductor layer that has been thinned to form openings;

filling the openings with a dielectric material to form dielectric regions; and forming through-vias penetrating through the dielectric regions to electrically couple to the interconnect structure.

2. The method of claim 1 further comprising, after the semiconductor layer is thinned, forming waveguides optically coupled to the photonic devices, wherein the waveguides are formed on an opposite side of the semiconductor layer than the photonic devices.

3. The method of claim 1 further comprising forming a reflector in one of the openings in the semiconductor layer.

4. The method of claim 3, wherein the reflector contacts the first dielectric layer.

5. The method of claim 1 further comprising bonding a supporting substrate over the electronic die.

6. The method of claim 5, wherein the supporting substrate comprises an optical lens.

7. The method of claim 1 further comprising:

forming a third dielectric layer, wherein the third dielectric layer is on an opposite side of the semiconductor layer than the photonic devices; and forming a reflector extending into the third dielectric layer.

8. The method of claim 7, wherein the forming the reflector comprises:

etching the third dielectric layer to form a recess in the third dielectric layer; and depositing a metal layer into the recess.

9. The method of claim 7, wherein the forming the reflector comprises:

etching the third dielectric layer to form a recess in the third dielectric layer; and placing a pre-formed reflector block in the recess, wherein the pre-formed reflector block comprises a slant metal layer, and a transparent material embedding the slant metal layer therein.

10. The method of claim 7, wherein the forming the reflector comprises:

etching the third dielectric layer to form a recess in the third dielectric layer; and forming optical crystals in the third dielectric layer, wherein the optical crystals have a periodic pattern.

11. The method of claim 7, wherein the forming the reflector comprises:

etching the third dielectric layer to form a recess in the third dielectric layer; and placing a transparent ball in the recess.

12. A method comprising:

patterning a top silicon layer in a substrate to form a plurality of photonic devices, wherein the substrate comprises the top silicon layer, a first dielectric layer under the top silicon layer, and a semiconductor layer under the first dielectric layer;

forming a second dielectric layer to embed the plurality of photonic devices therein;

forming an interconnect structure over and signally coupled to the plurality of photonic devices;

bonding an electronic die to the interconnect structure;

thinning the semiconductor layer;

patterning the semiconductor layer that has been thinned to form openings;

forming a reflector in one of the openings in the semiconductor layer, wherein the reflector is configured to reflect an optical signal received by the reflector to an edge coupler adjacent to the reflector;

filling the openings with a dielectric material to form dielectric regions; and forming through-vias penetrating through the dielectric regions to electrically couple to the interconnect structure.

13. The method of claim 12 further comprising, after the semiconductor layer is thinned, forming waveguides optically coupled to the photonic devices, wherein the waveguides are formed on an opposite side of the semiconductor layer than the photonic devices.

14. The method of claim 12, wherein the reflector contacts the first dielectric layer.

15. The method of claim 12 further comprising bonding a supporting substrate over the electronic die.

16. A method comprising:

patterning a top silicon layer in a substrate to form a plurality of photonic devices, wherein the substrate comprises the top silicon layer, a first dielectric layer under the top silicon layer, and a semiconductor layer under the first dielectric layer;

forming a second dielectric layer to embed the plurality of photonic devices therein;

forming an interconnect structure over and signally coupled to the plurality of photonic devices;

bonding an electronic die to the interconnect structure;

thinning the semiconductor layer;

patterning the semiconductor layer that has been thinned to form openings;

filling the openings with a dielectric material to form dielectric regions; and forming through-vias penetrating through the dielectric regions to electrically couple to the interconnect structure, wherein at a time after the through-vias are formed, a portion of the semiconductor layer remains.

17. The method of claim 16 further comprising, after the semiconductor layer is thinned, forming waveguides optically coupled to the photonic devices, wherein the waveguides are formed on an opposite side of the semiconductor layer than the photonic devices.

18. The method of claim 16 further comprising forming a reflector in one of the openings in the semiconductor layer.

19. The method of claim 16 further comprising bonding a supporting substrate over the electronic die, and wherein the supporting substrate comprises an optical lens.

20. The method of claim 16 further comprising:

forming a third dielectric layer, wherein the third dielectric layer is on an opposite side of the semiconductor layer than the photonic devices; and forming a reflector extending into the third dielectric layer.

* * * * *